(12) United States Patent
Tanaka et al.

(10) Patent No.: US 10,184,170 B2
(45) Date of Patent: Jan. 22, 2019

(54) ETCHING SOURCE INSTALLABLE IN A STORAGE MEDIUM PROCESSING TOOL

(71) Applicant: Seagate Technology LLC, Cupertino, CA (US)

(72) Inventors: Samuel Lewis Tanaka, Fremont, CA (US); Thomas Larson Greenberg, Berkeley, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/916,081

(22) PCT Filed: Jan. 17, 2014

(86) PCT No.: PCT/US2014/011981
§ 371 (c)(1),
(2) Date: Mar. 2, 2016

(87) PCT Pub. No.: WO2015/108528
PCT Pub. Date: Jul. 23, 2015

(65) Prior Publication Data
US 2016/0203956 A1    Jul. 14, 2016

(51) Int. Cl.
*C23C 14/34* (2006.01)
*H01J 37/32* (2006.01)
(Continued)

(52) U.S. Cl.
CPC ............ *C23C 14/34* (2013.01); *C23C 14/022* (2013.01); *C23C 14/56* (2013.01); *H01J 37/32009* (2013.01); *H01J 37/3244* (2013.01); *H01J 37/32403* (2013.01); *H01J 37/32532* (2013.01); *H01J 37/32862* (2013.01); *H01J 37/32889* (2013.01); *H01J 37/34* (2013.01); *H01J 2237/334* (2013.01)

(58) Field of Classification Search
CPC ...................... H01J 37/32899; H01J 37/32403
See application file for complete search history.

(56) References Cited

U.S. PATENT DOCUMENTS 4,208,240 A    6/1980    Latos
4,289,598 A *  9/1981    Engle ..................... C23C 14/34
                                                      118/723 E
(Continued)

FOREIGN PATENT DOCUMENTS

JP    S63-157870 A    6/1988
JP    H06-177077 A    6/1994
(Continued)

OTHER PUBLICATIONS

International Search Report and Written Opinion for International Patent Application No. PCT/US2014/011981, dated Oct. 24, 2014, 13 pages.

*Primary Examiner* — Jason Berman
(74) *Attorney, Agent, or Firm* — Westman, Champlin & Koehler, P.A.

(57) ABSTRACT

A plasma etching source installable into at least one of multiple compartments of a sputter deposition tool. The plasma etching source includes a first mounting plate and at least one electrode plate coupled to the first mounting plate. A gas inlet is included in the first mounting plate of the plasma etching source.

13 Claims, 24 Drawing Sheets

(51) Int. Cl.
*C23C 14/02* (2006.01)
*C23C 14/56* (2006.01)
*H01J 37/34* (2006.01)

(56) References Cited

U.S. PATENT DOCUMENTS

| | | | |
|---|---|---|---|
| 4,676,865 A * | 6/1987 | DeLarge | H05K 3/0055 |
| | | | 156/345.45 |
| 4,825,808 A | 5/1989 | Takahashi et al. | |
| 5,310,410 A | 5/1994 | Begin et al. | |
| 5,667,592 A * | 9/1997 | Boitnott | C23C 14/568 |
| | | | 118/719 |
| 5,957,648 A | 9/1999 | Bachrach | |
| 6,101,972 A * | 8/2000 | Bluck | C23C 16/26 |
| | | | 118/723 E |
| 6,159,388 A | 12/2000 | Yanagisawa et al. | |
| 6,251,232 B1 * | 6/2001 | Aruga | C23C 14/50 |
| | | | 118/503 |
| 6,328,858 B1 | 12/2001 | Felsenthal et al. | |
| 6,919,001 B2 | 7/2005 | Fairbairn et al. | |
| 7,540,257 B2 * | 6/2009 | Kishimoto | H01J 37/32431 |
| | | | 118/723 E |
| 2009/0134012 A1 | 5/2009 | Shibamoto et al. | |
| 2016/0024657 A1 | 1/2016 | Sakamoto et al. | |

FOREIGN PATENT DOCUMENTS

| | | |
|---|---|---|
| JP | 2000-273615 A | 10/2000 |
| JP | 2005-79416 A | 3/2005 |
| JP | 2006-196681 A | 7/2006 |
| JP | 2008-150711 A | 7/2008 |
| JP | 2009-191356 A | 8/2009 |
| WO | 00/18979 A1 | 4/2000 |
| WO | 2014/142023 A1 | 2/2017 |

* cited by examiner

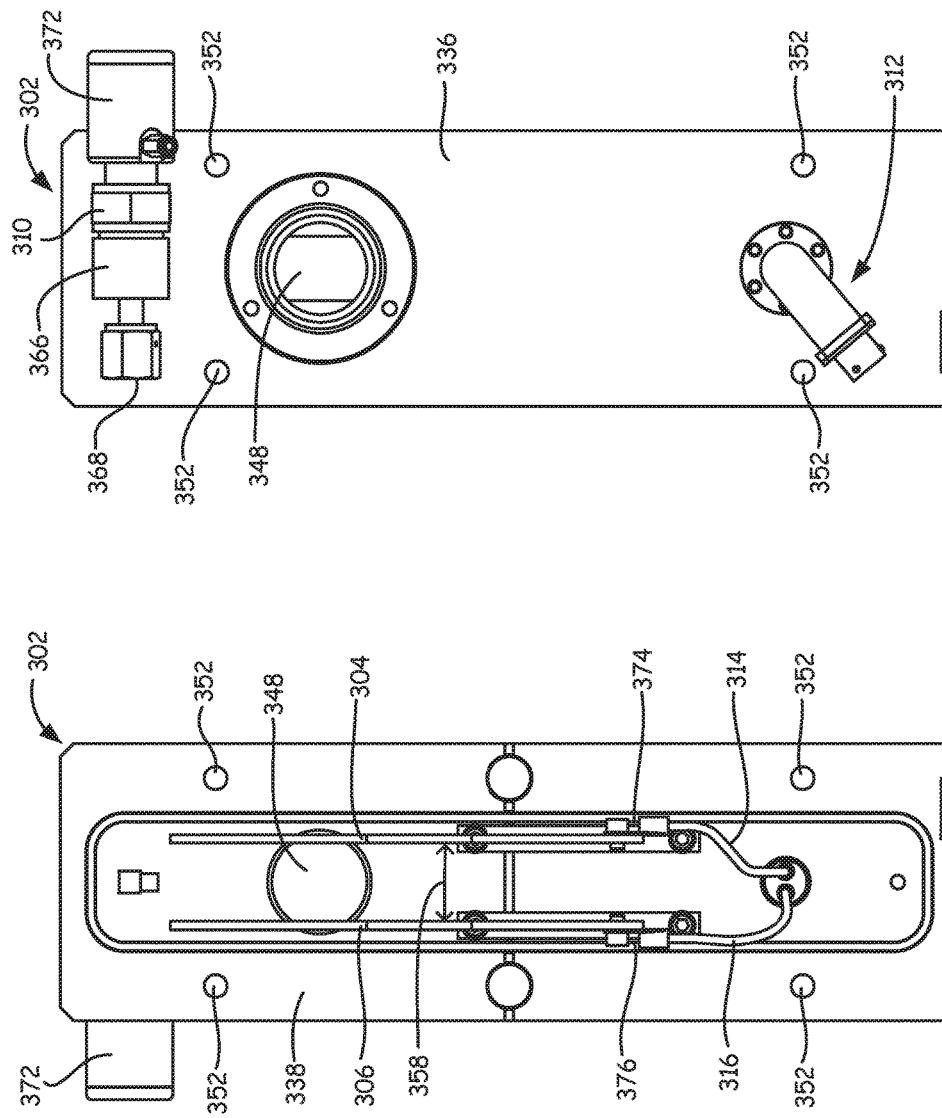

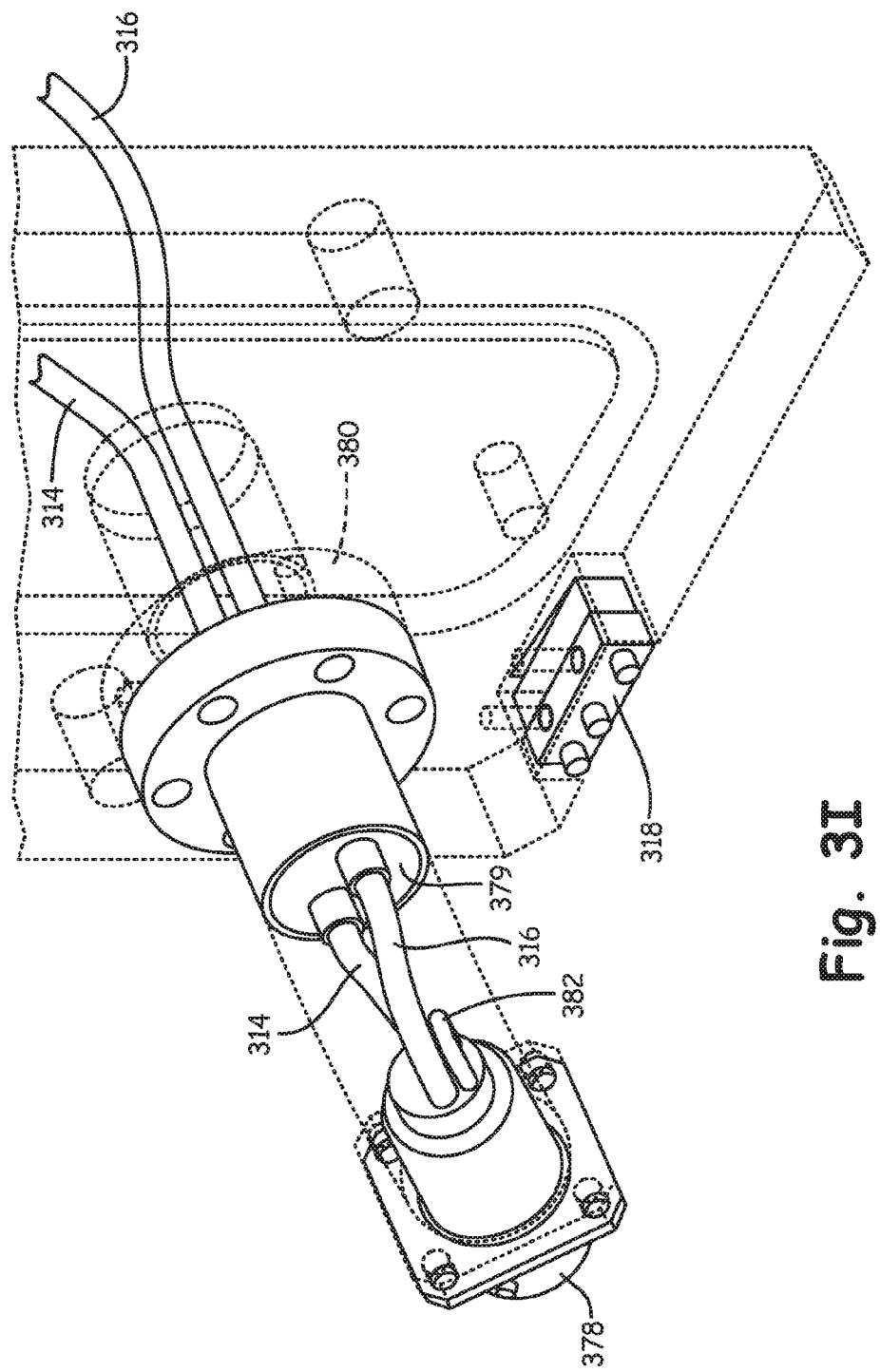

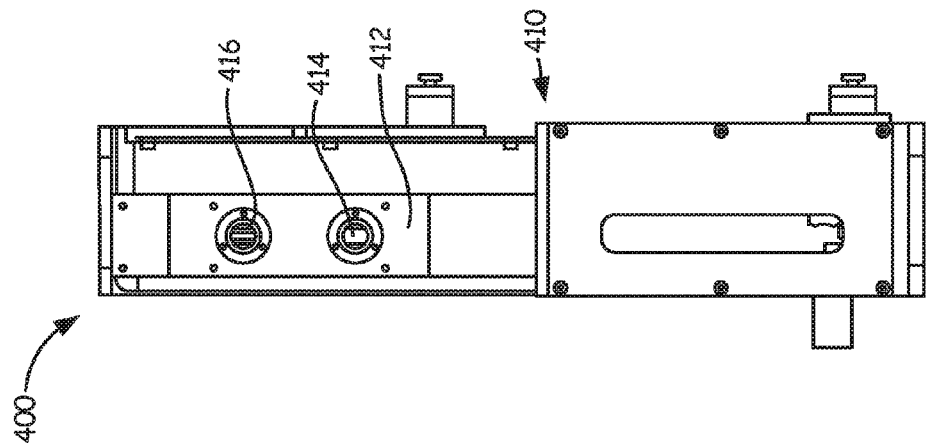
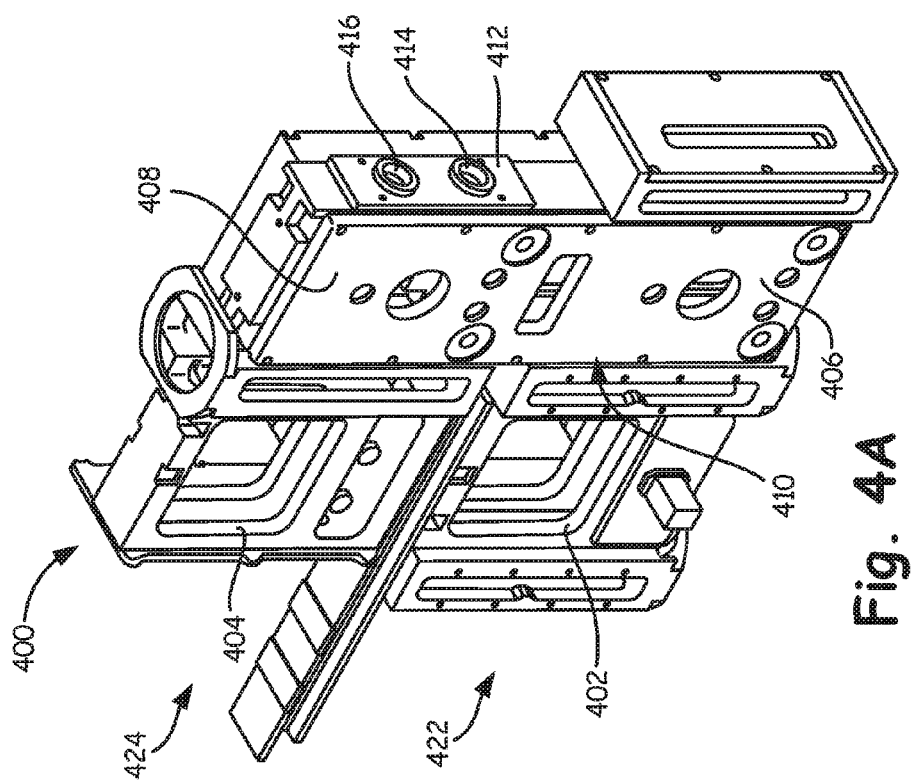

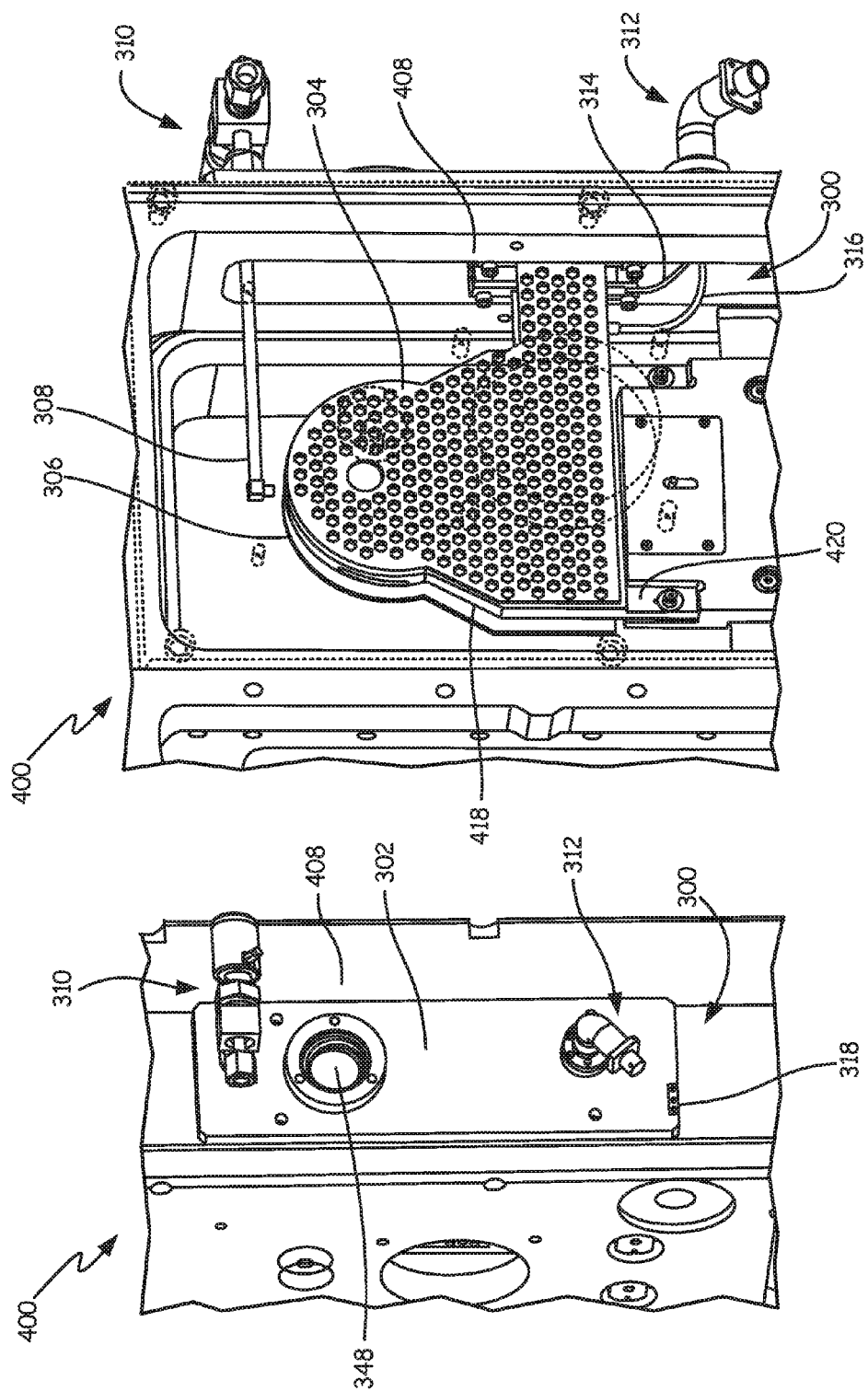

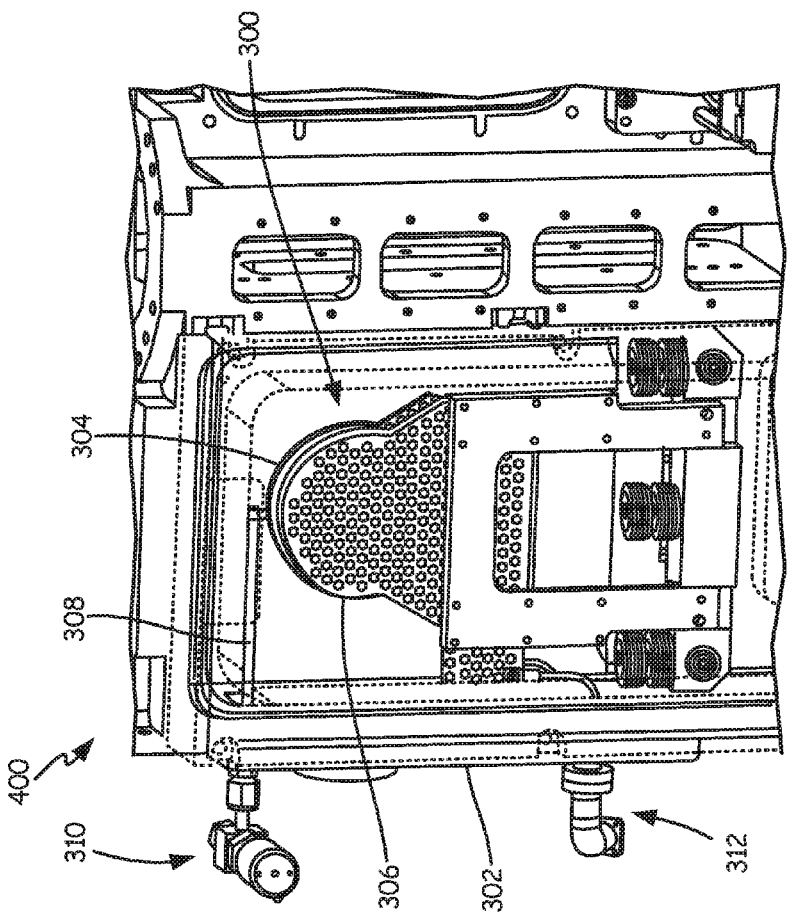

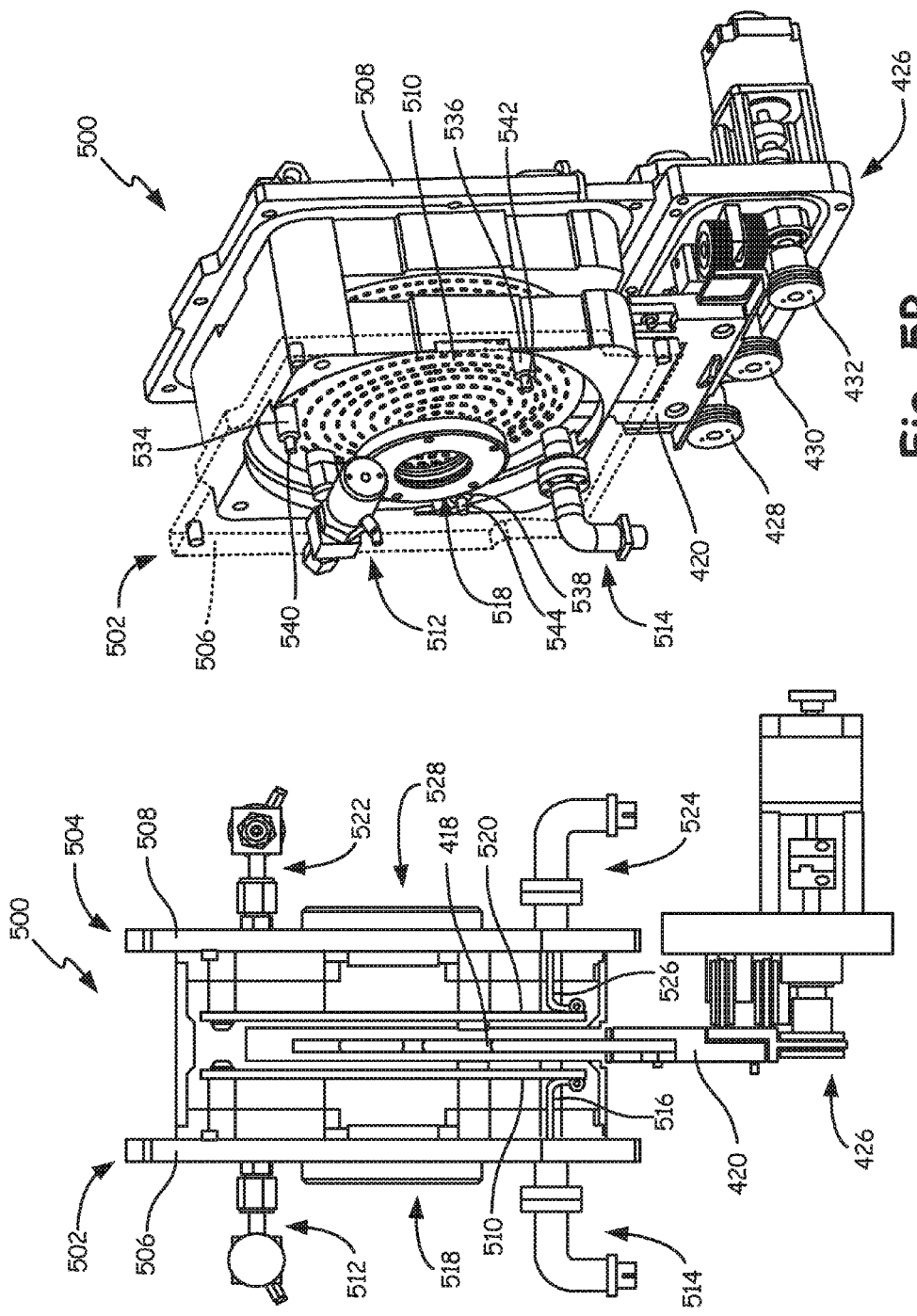

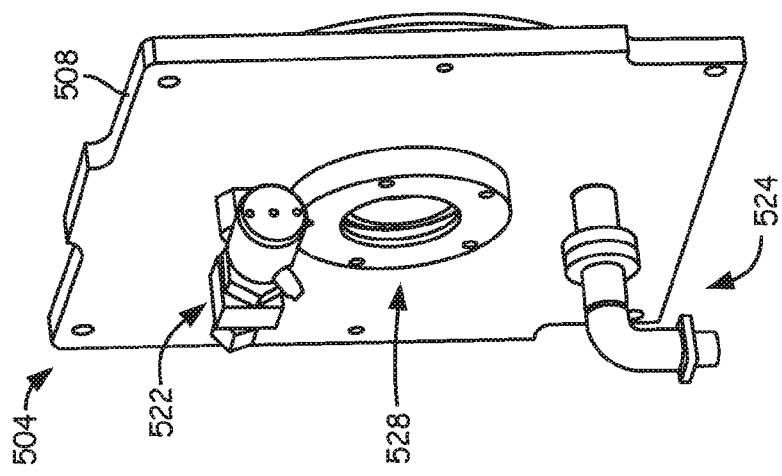
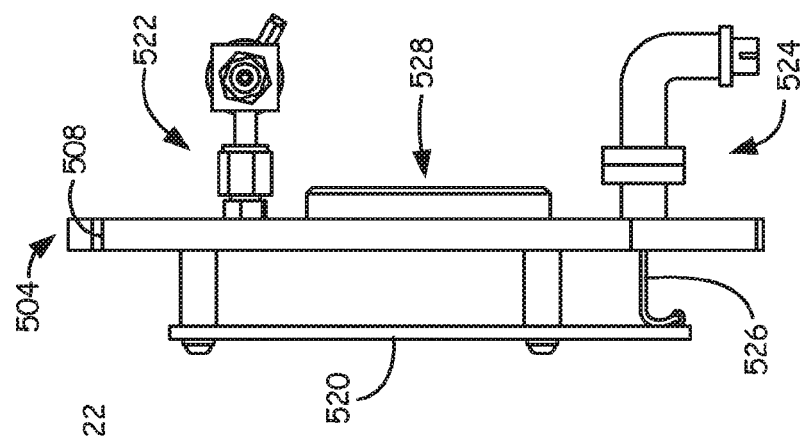
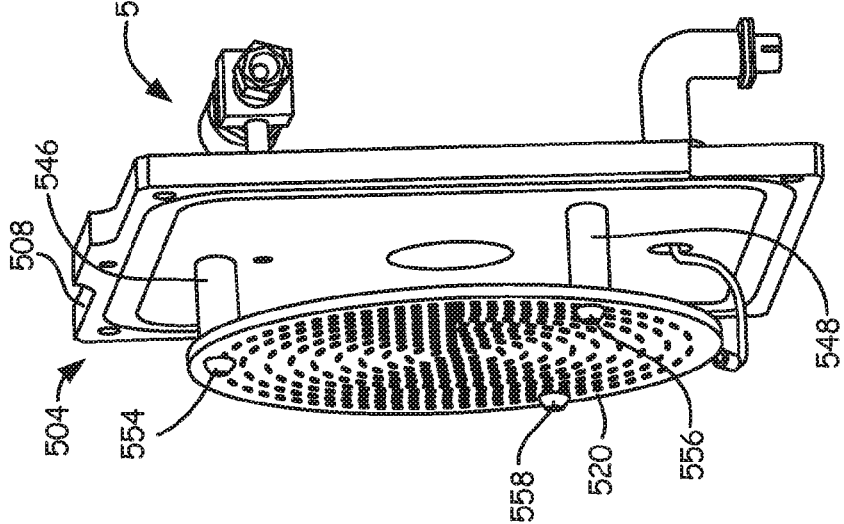

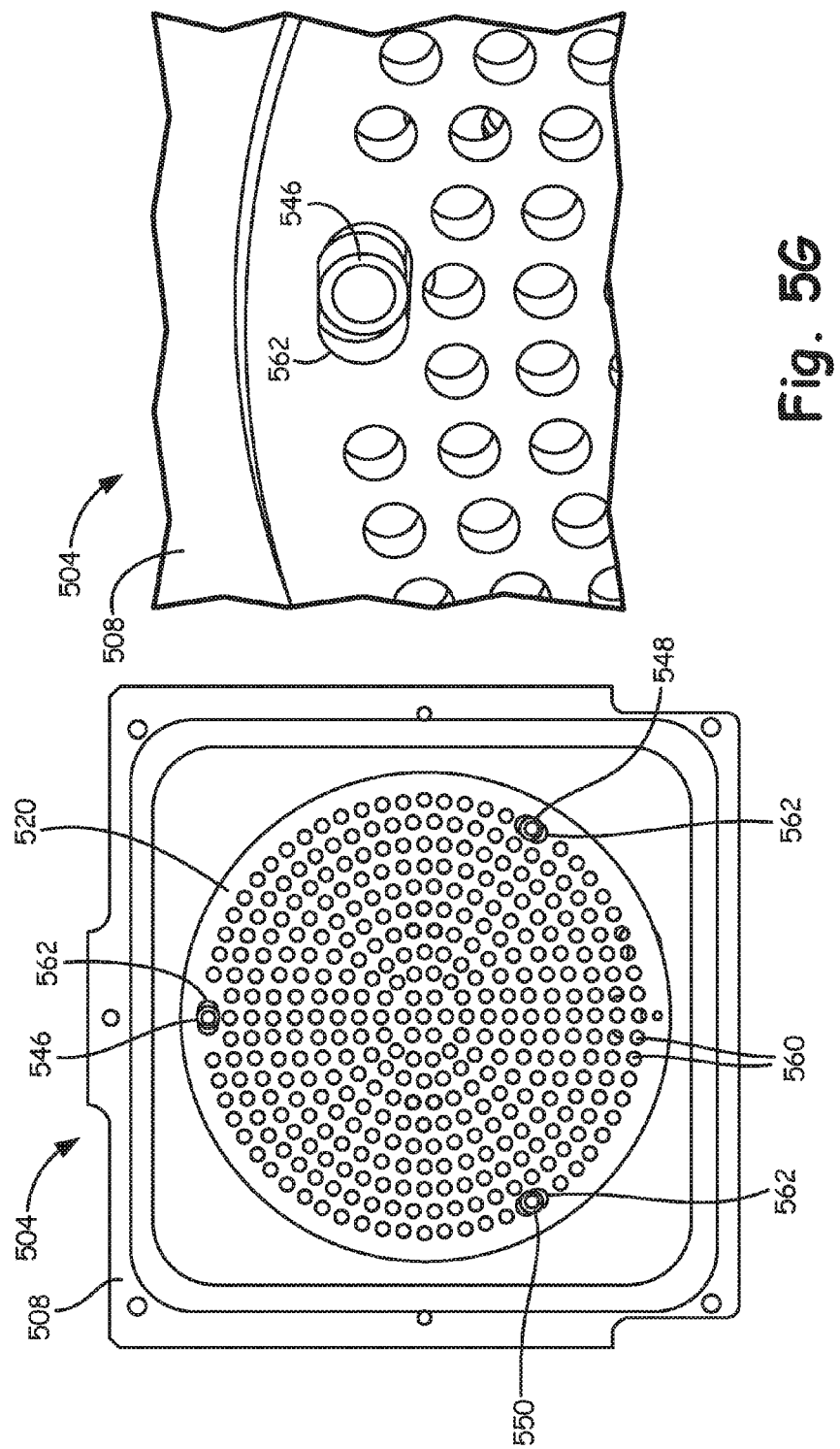

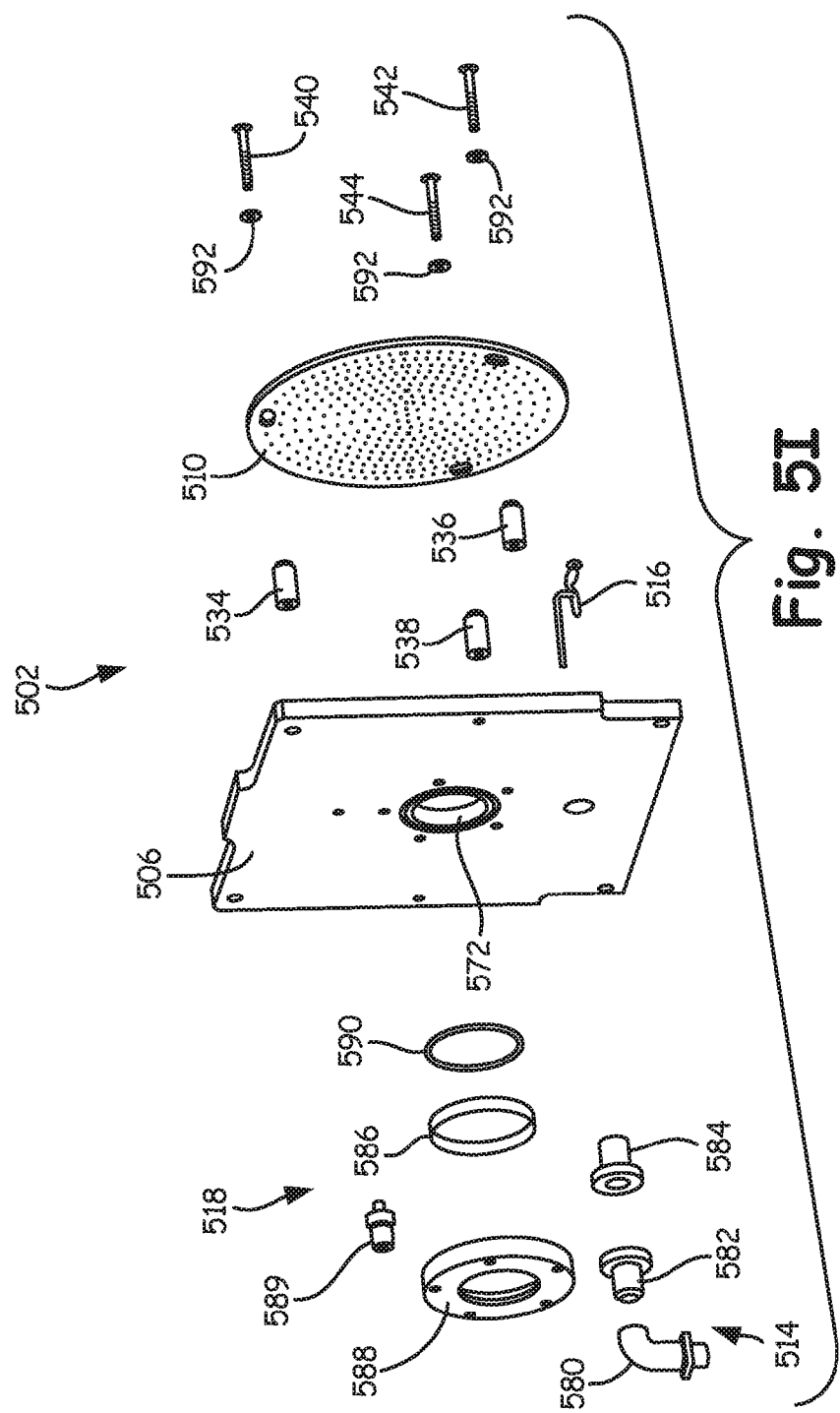

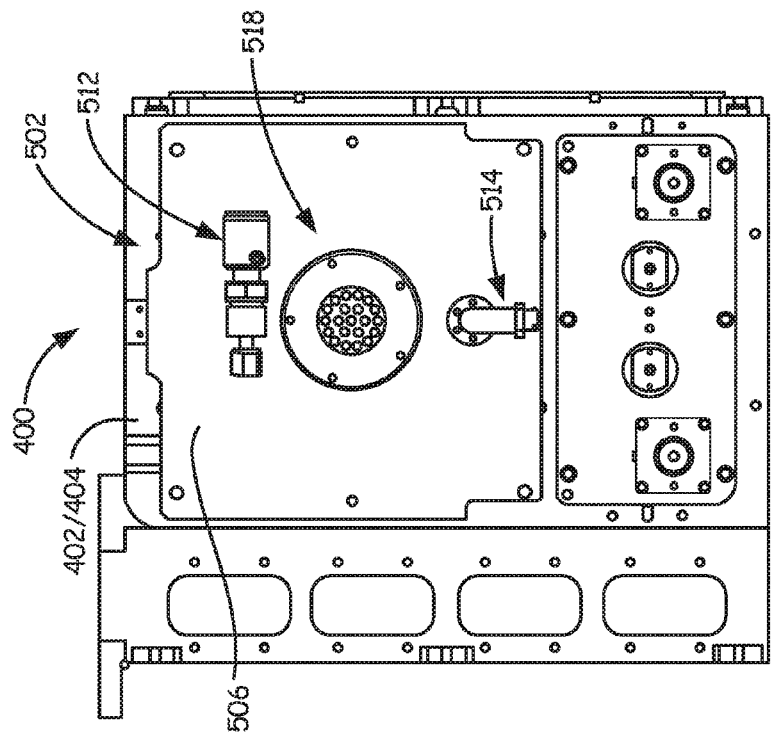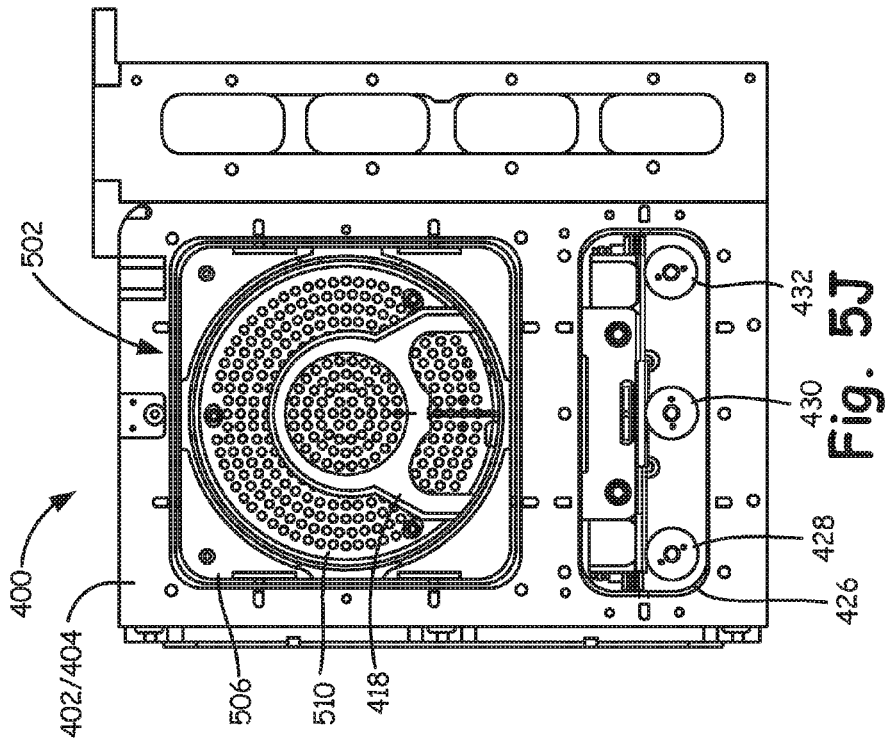

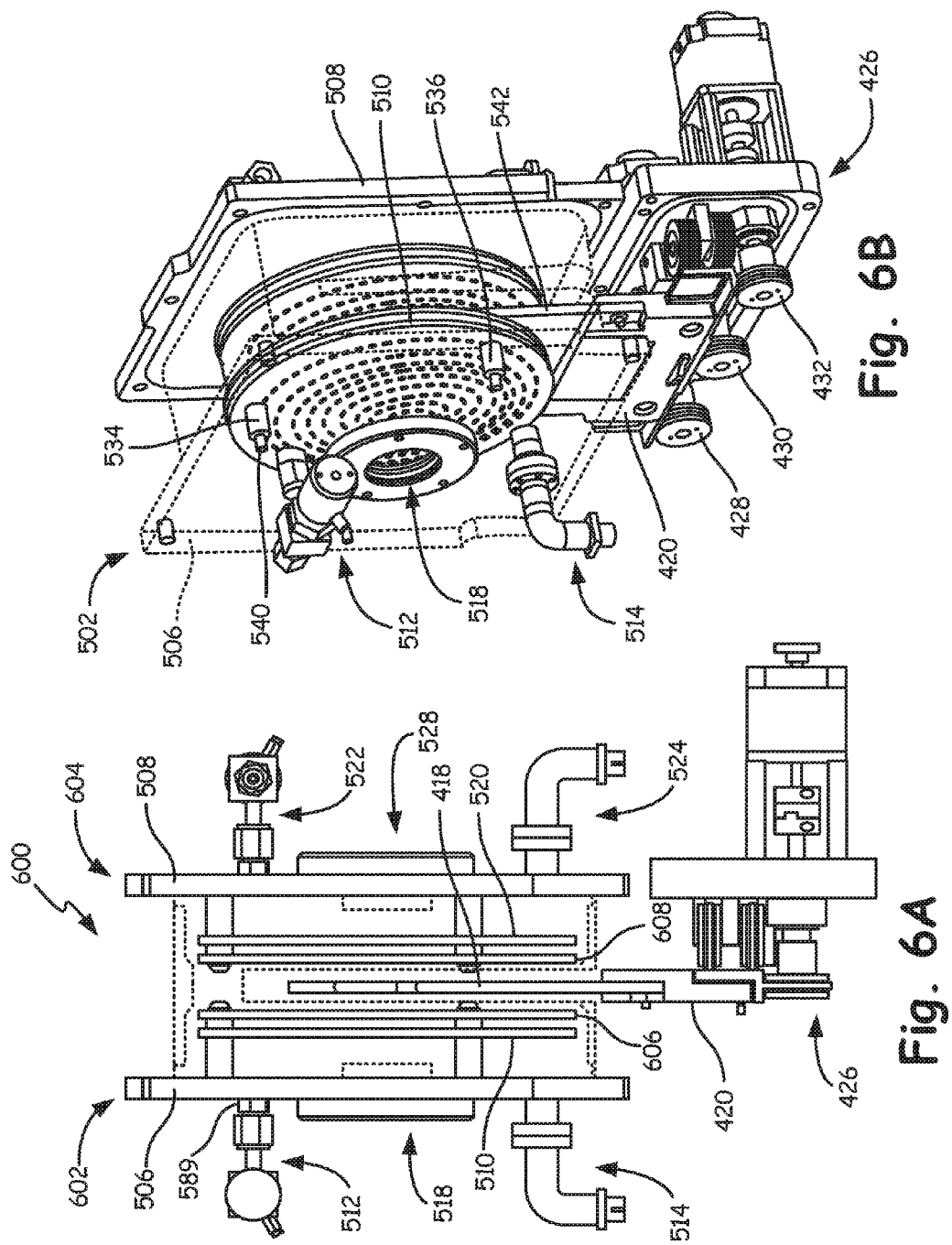

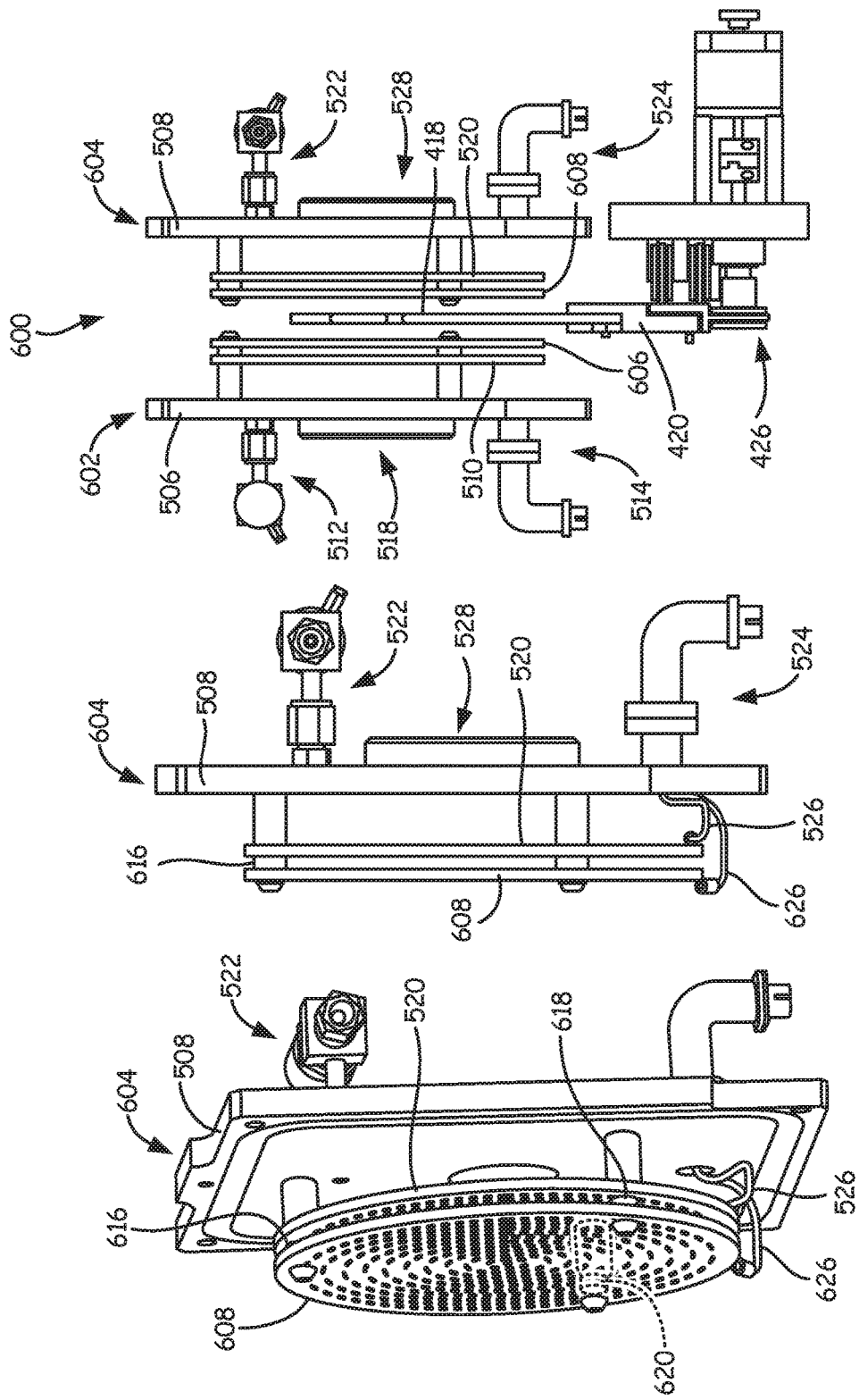

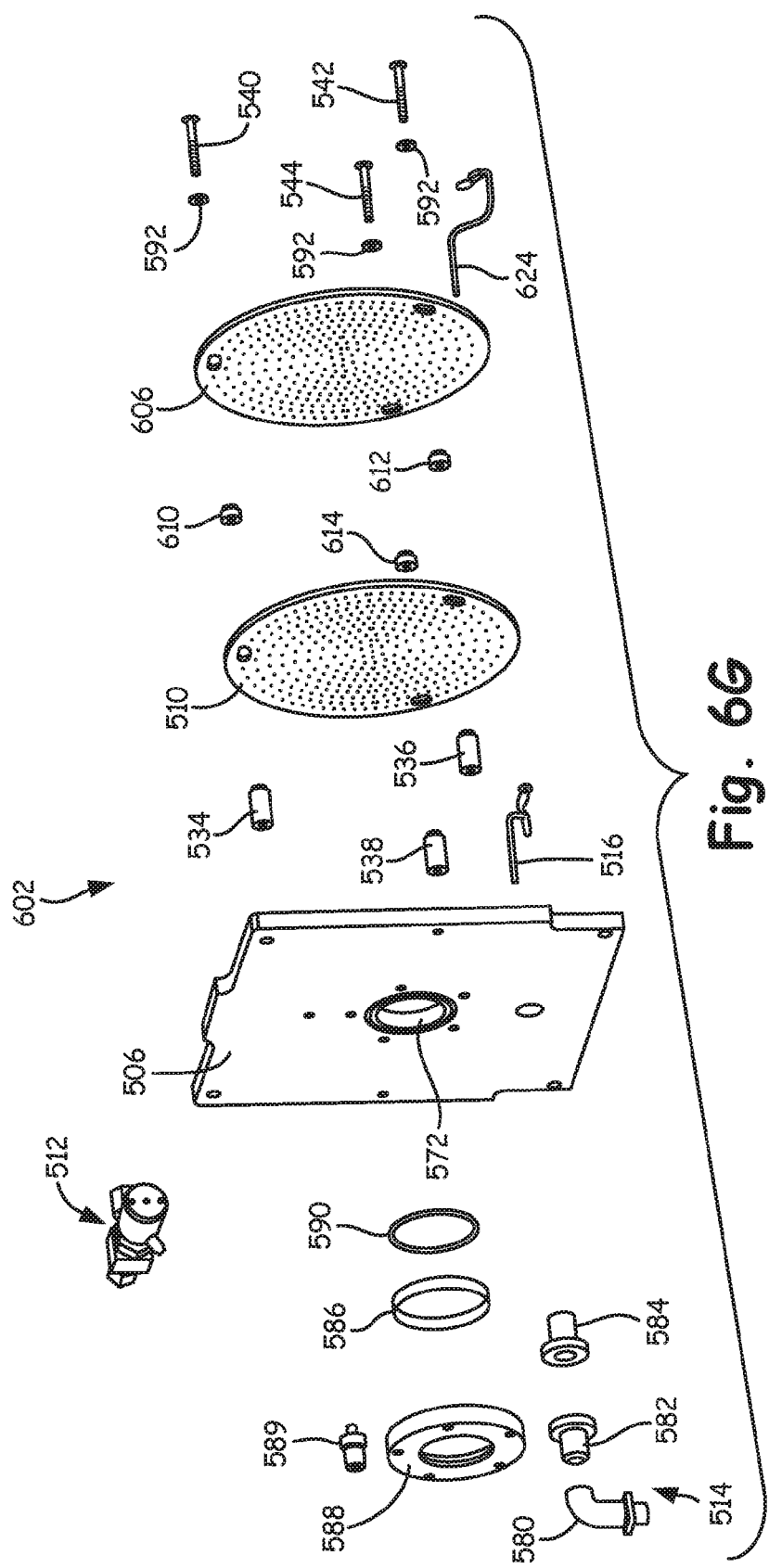

ETCHING SOURCE INSTALLABLE IN A STORAGE MEDIUM PROCESSING TOOL

CROSS-REFERENCE TO RELATED APPLICATION

This Application is a Section 371 National Stage Application of International Application No. PCT/US2014/011981, filed 17 Jan. 2014 and published as WO 2015/108528 A1 on 23 Jul. 2015, in English, the contents of which are hereby incorporated by reference in their entirety.

BACKGROUND

Data storage systems commonly have one or more data storage media and one or more elements that communicate with the data storage media to store and retrieve data. Data storage media may be magnetic storage media, optical storage media, etc. Magnetic storage media such as magnetic discs may comprise a substrate on which a non-magnetic underlayer, a magnetic layer and a protective overcoat are deposited by vacuum sputter deposition, followed by application of a thin layer of lubricant. A sputter deposition tool used for magnetic disc fabrication may include one or more disc holding fixtures. Such fixtures may be exposed to environmental contaminants prior to being installed in the sputter deposition tool. Also, sputter particles may accumulate on the disc holding fixtures after prolonged use of the fixtures in the sputter deposition tools.

SUMMARY

The present disclosure relates to etching sources that are easily installable into, for example, sputter deposition tools where the etching sources are utilized to bombard surfaces of components of the sputter deposition tool, such as surfaces of disc holding fixtures, with suitable particles, for example, to clean off contaminants from the surfaces.

A first apparatus embodiment includes a sputter deposition tool having a plurality of compartments. The apparatus also includes an etching source removably installable into at least one of the plurality of compartments of the sputter deposition tool.

A second apparatus embodiment is directed to a plasma etching source. The plasma etching source includes a first mounting plate and at least one electrode plate coupled to the first mounting plate. A gas inlet is included in the first mounting plate.

A first method embodiment includes operating an etching source in one of a plurality of compartments of a sputter deposition tool. The method also includes etching a storage medium holding fixture of the sputter deposition tool in the one of the plurality of compartments of the sputter deposition tool. The method further includes sputter processing a storage medium, which is supported by the storage medium holding fixture, in other ones of the plurality of compartments of the sputter deposition tool.

A second method embodiment includes sputter processing a storage medium that is supported by a storage medium holding fixture, and etching the storage medium holding fixture.

Other features and benefits that characterize embodiments of the disclosure will be apparent upon reading the following detailed description and review of the associated drawings.

BRIEF DESCRIPTION OF THE DRAWINGS

FIGS. 3A-3I illustrate different views of a plasma etching source in accordance with one embodiment.

FIGS. 4A and 4B illustrate different views of a sputter deposition tool.

FIGS. 4C-4H illustrate different views of the sputter deposition tool of FIGS. 4A and 4B with a plasma etching source installed therein.

FIG. 5A-5K illustrate different views of a plasma etching source in accordance with one embodiment.

FIGS. 6A-6H illustrate different views of a plasma etching source in accordance with one embodiment.

DETAILED DESCRIPTION OF ILLUSTRATIVE EMBODIMENTS

Figure 1:
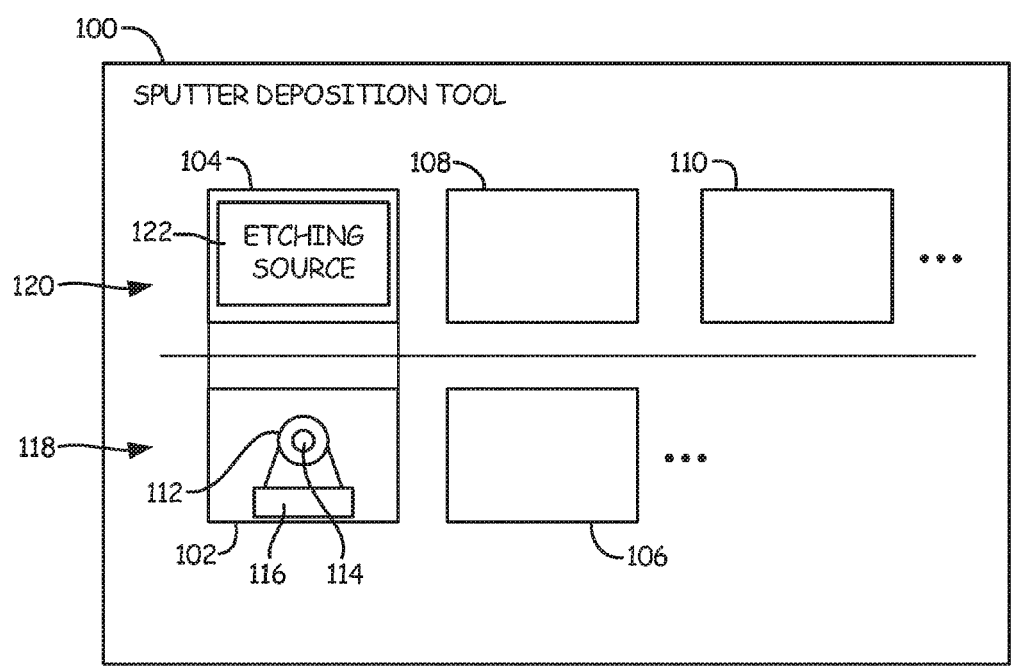
FIG. 1 is a simplified block diagram of a sputter deposition tool having a compartment into which an etching source is installed in accordance with one embodiment.

FIG. 1 is a simplified block diagram of a sputter deposition tool 100 having a compartment into which an etching source is installed in accordance with one embodiment. Sputter deposition tool 100 may be utilized to carry out, for example, vacuum sputter deposition of a non-magnetic underlayer, a magnetic layer and a protective overcoat on a disc substrate. Sputter deposition tool 100 may include multiple compartments 102, 104, 106, 108, 110, etc. A disc holding fixture 112 shown within compartment 102 is used to hold a disc 114 in a substantially vertical position, for example, during processing within tool 100. The disc holding fixture 112 is attached to a support element 116 that enables movement of the disc holding fixture 112 between the different compartments 102, 104, 106, 108 and 110. In some embodiments, compartments 102 and 104, for example, may be compartments of an elevator that enables movement of the disc holding fixture 112 and its attached support member 116 between, for example, a first level 118 and a second level 120 of tool 100. Other compartments such as 106, 108 and 110 may contain equipment to deposit different layers, such as the non-magnetic underlayer, the magnetic layer and the protective overcoat on the disc substrate. In the embodiment shown in FIG. 1, an etching source 122 is included in compartment 104. Compartment 104 may serve a dual purpose of being both an elevator compartment and an etching compartment. As noted above, etching source 122 is utilized to bombard surfaces of components of tool 100, such as surfaces of disc holding fixture 112, with suitable particles, for example, to clean off contaminants from the surfaces. In one embodiment, etching source 122 is a plasma etching source that produces a high-speed stream of glow discharge (plasma) of an appropriate gas or mixture of gases being shot (in pulses, for example) at disc holding fixture 112, for example. The plasma may be either charged (ions) or neutral (atoms and radicals).

Figure 2:
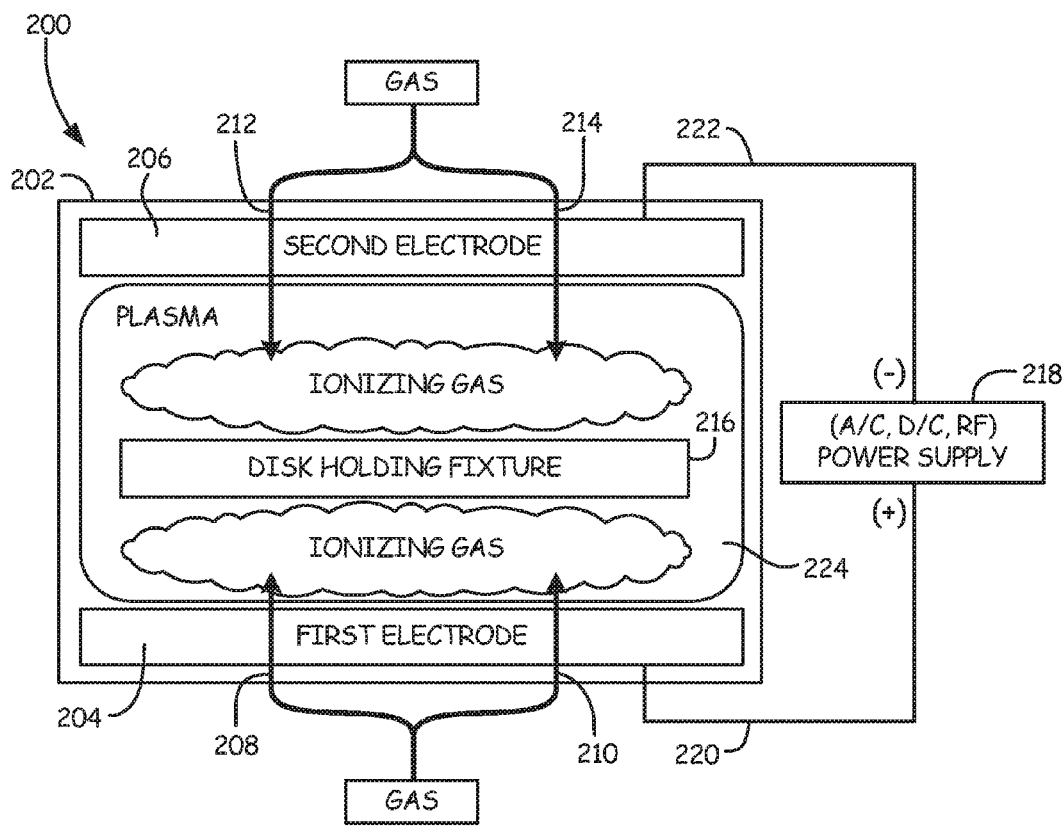
FIG. 2 is a simplified block diagram of components of a plasma etching source in accordance with one embodiment.

FIG. 2 is a simplified block diagram of components of a plasma etching source 200 in accordance with one embodiment. Plasma etching source 200 includes a reaction chamber 202 that houses a first electrode 204 and a second electrode 206. Reaction chamber 202 may include one or more gas inlets such as 208, 210, 212 and 214. In FIG. 2, block 216 represents a disc holding fixture positioned within reaction chamber 202. Electrodes 204 and 206, which may be substantially similarly sized opposing plates, are electrically coupled to a power supply 218 via a first electrical connector 220 and a second electrical connector 222, respectively. In some embodiments, power supply 218 is a direct current (DC) power supply. In such embodiments, an etching gas (for example, an inert gas such as argon) introduced into reaction chamber 202 is formed into a plasma 224 by supplying DC electric power to electrodes 204 and 206. In other embodiments, power supply 218 may be an alternating current (AC) power supply. In embodiments that utilize the AC power supply, a radio frequency (RF) AC voltage may be applied between electrodes 204 and 206 when reaction chamber 202 is filled with argon, for example. In such embodiments, the application of the RF AC voltage causes free electrons to oscillate and collide with gas molecules leading to plasma 224. Plasma 224 interacts with surfaces of disc holding fixture 216, for example, to remove contaminants from its surfaces. It should be noted that disc holding fixture 216 may be at a floating electrical potential, which is the potential at which an object in contact with the plasma collects no current (i.e., the potential attained by an electrically isolated body in the plasma). Applying the etch potential between electrode plates 204 and 206 with the disc holding fixture 216 at a floating potential enables substantially simultaneous etching of multiple (for example, opposing) surfaces of disc holding fixture 216. Details of a plasma etching source designed to facilitate easy installation into a compartment of a sputter deposition tool such as 100 are provided below in connection with FIG. 3A-3I.

FIGS. 3A-3I illustrate different views of a plasma etching source 300 in accordance with one embodiment. To facilitate easy installation of plasma etching source 300 into a compartment of a sputter deposition tool such as 100, primary components of the plasma etching source 300 are mounted on a single mounting or support plate 302. In some embodiments, mounting plate 302 is sized to correspond with a size of a window of a compartment of a sputter deposition tool such as 100.

In addition to mounting plate 302, plasma etching source 300 includes electrode plates 304 and 306, a gas inlet tube 308, a gas valve assembly 310, an electrical power connection assembly 312, a first electrical connector 314, a second electrical connector 316, an interlock switch 318, insulating supports 320, 322, 324 and 326, and fasteners 328, 330, 332 and 334.

Mounting plate 302 includes an outer side 336, an inner side 338, a top surface 340, a bottom surface 342, a left side surface 344 and a right side surface 346. It should be noted that the terms "left side surface" and "right side surface" are used with reference to the inner side 338 when the mounting plate 302 is in an upright position with the top surface 340 above the bottom surface 342 and when the mounting plate 302 is viewed from the inner side 338. Mounting plate 302 may include a view port hole 348, an electrical connection hole 350 and a plurality of other holes 352, which may be used to receive fasteners. Bottom surface 342 of mounting plate 302 may also include a recess 343 that is suitably sized to receive interlock switch 318. Mounting plate 302 may be made of any suitable material.

Electrode plates 304 and 306 may be substantially similarly sized opposing plates. Additionally, electrode plates 304 and 306 may be sized and shaped to correspond with a size and shape of, for example, a storage medium holding fixture such as 112 (of FIG. 1). Electrodes plates 304 are integrally formed with or otherwise attached to electrode base portions 354 and 356. Electrode plates 304 and 306 are mounted and supported on mounting plate 302 with the help of insulating supports 320, 322, 324 and 326 and fasteners 328, 330, 332 and 334. Fasteners 328, 330, 332 and 334 may be threaded screws. Screws 328, 330, 332 and 334 may be passed through holes in base portions 354 and 356 and through corresponding holes in insulating supports 320, 322, 324 and 326, and then screwed into threaded receiving holes (not shown) in mounting plate 302. Insulating supports 320, 322, 324 and 326 may be ceramic insulating supports. Electrode plates 304 and 306 may be separated from each other by a distance denoted by reference numeral 358 (shown in FIG. 3C), which, in some embodiments, may be about 1.125 inches. Of course, other suitable separation distances between electrode plates 304 and 306 may be used in different applications. In some embodiments, electrode plates 304 and 306 may comprise a plurality of through holes 360, which may enable a reactant gas to flow into a plasma smoothly and may thereby enable more efficient plasma etching.

A reactant gas is received within etching source 300 via gas inlet tube 308. Gas inlet tube 308 passes through mounting plate 302. A first end 362 of gas inlet tube 308 may be proximate to outer side 336 of mounting plates 302 and a second end 364 of gas inlet tube 308 may be proximate to electrode plates 304 and 306. The reactant gas is released into the etching source 300 from the second end 364 of the gas inlet tube 308. First end 362 of gas inlet tube 308 is coupled to gas valve assembly 310. Gas inlet tube 308 may be made of any suitable material.

Gas valve assembly 310 includes a valve body 366 having an inlet 368 and an outlet 370. A control knob 372 is operably coupled to the valve body 366. Inlet 368 may be connected to a reactant gas source such as a cylinder (not shown) containing the reactant gas, and outlet 370 is coupled to the first end 362 of gas inlet tube 308. Turning knob 372 to an open position, for example, may allow the reactant gas to flow into the etching source 300. Similarly, knob 372 may be turned from the open position to a closed position to prevent the reactant gas from flowing into the etching source 300. Valve assembly 310 may be any suitable type of gas valve assembly.

Figure 3A:
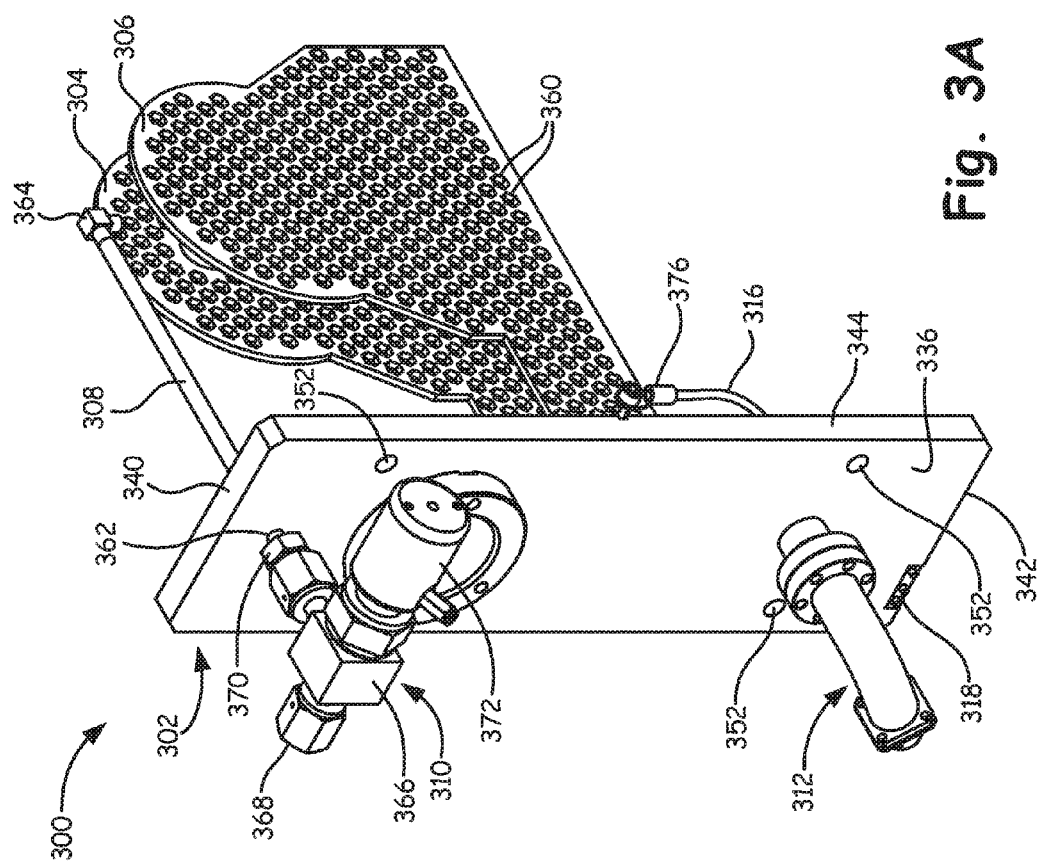
Figure 3B:
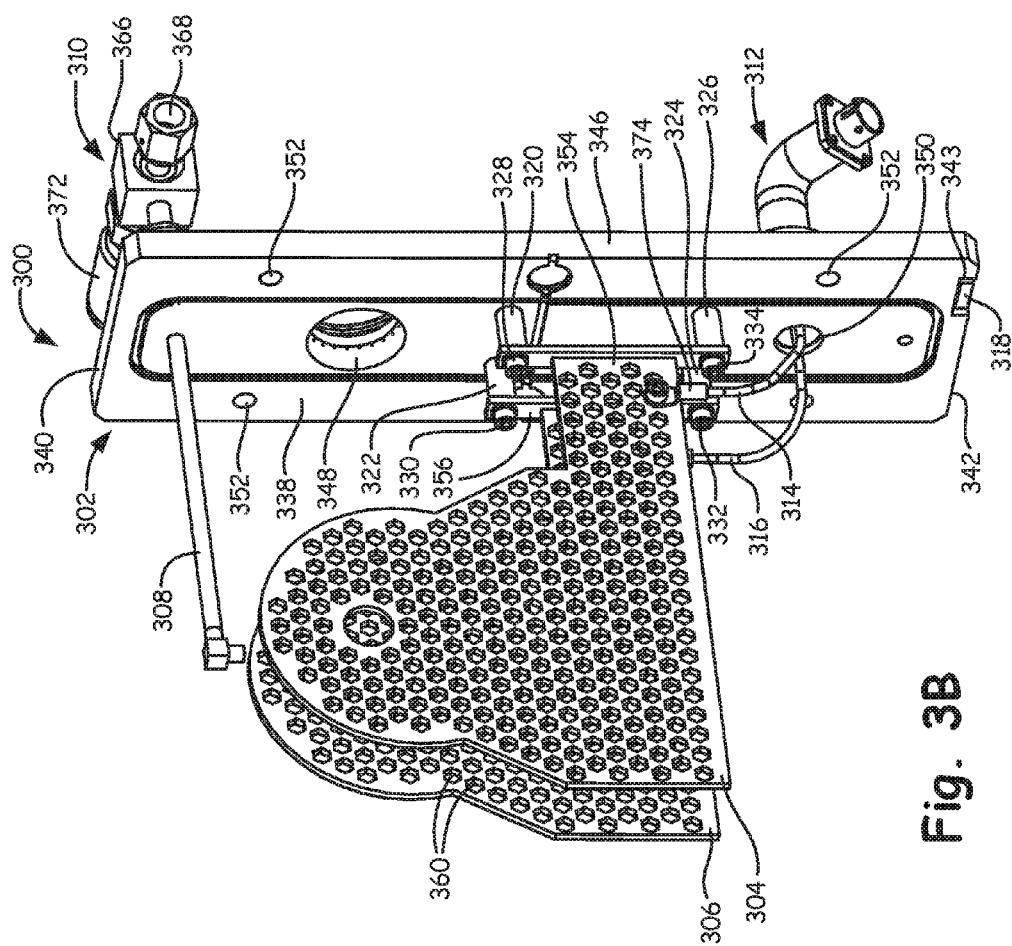
Figure 3E:
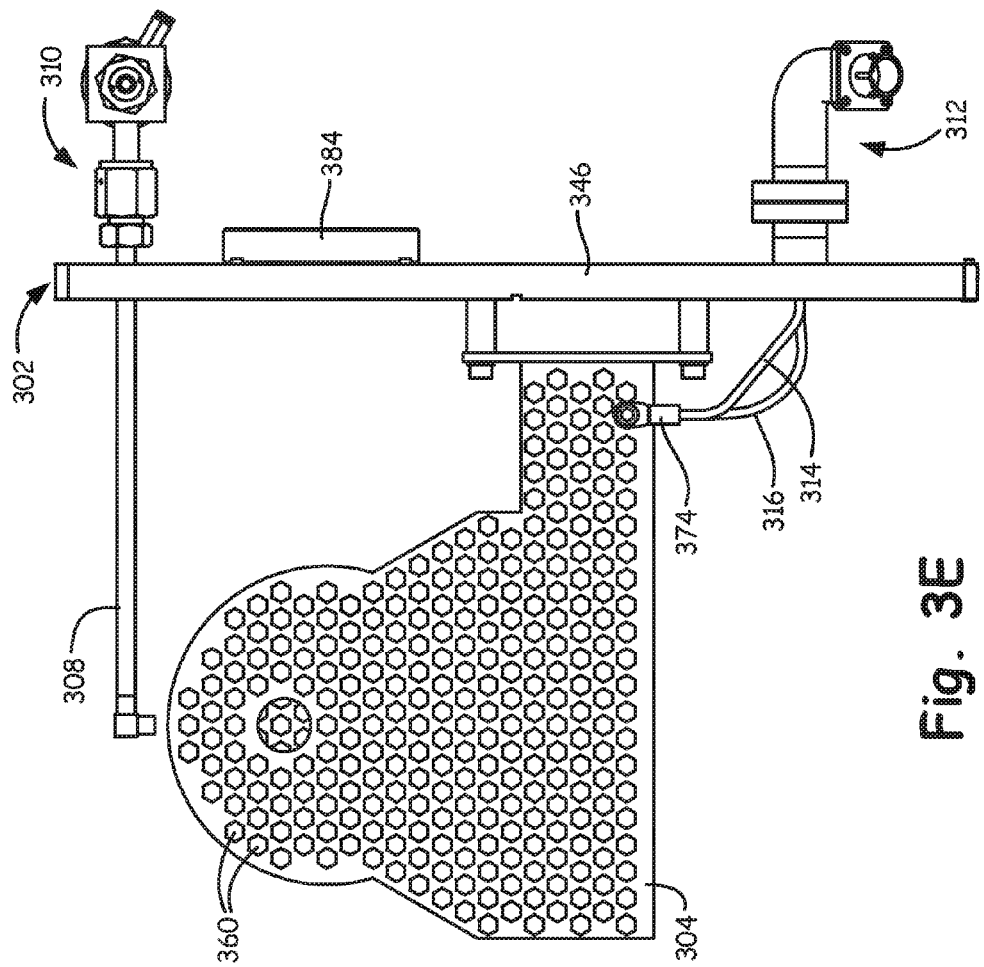
Figure 3F:
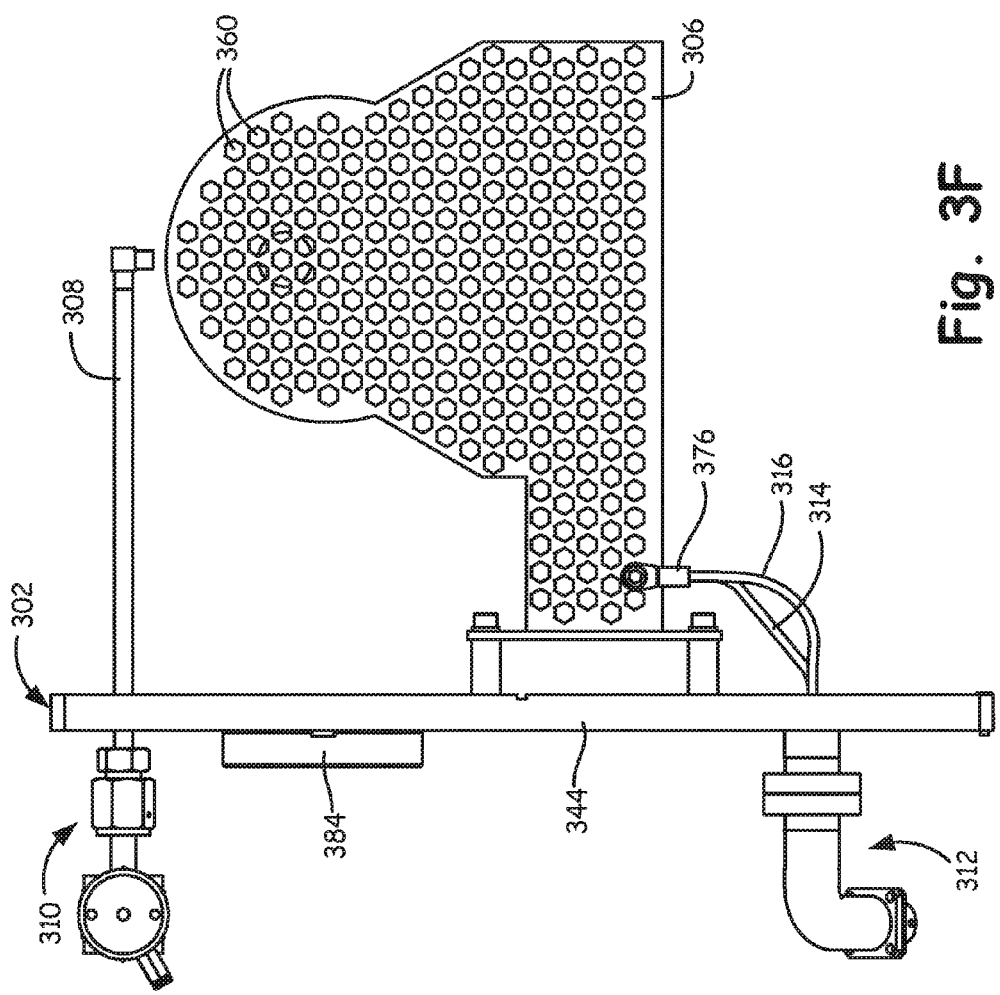
Figure 3H:
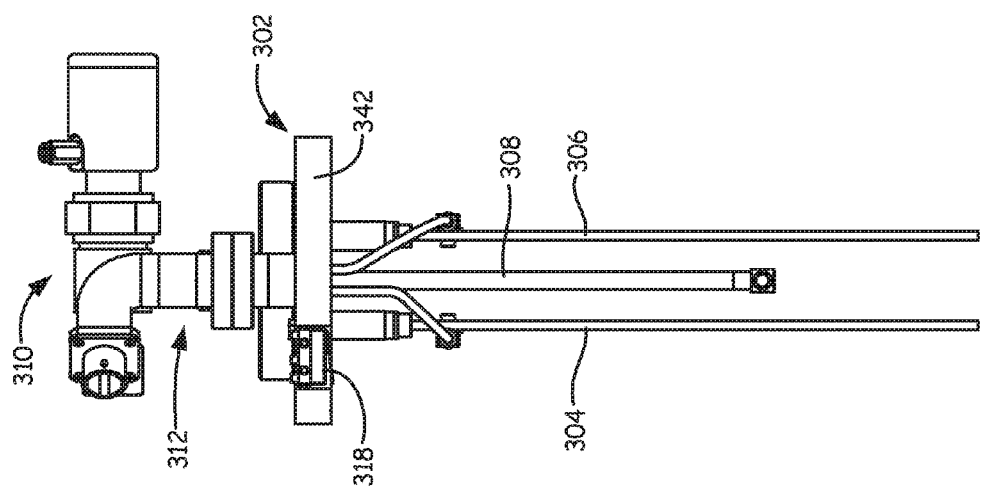
Figure 3G:
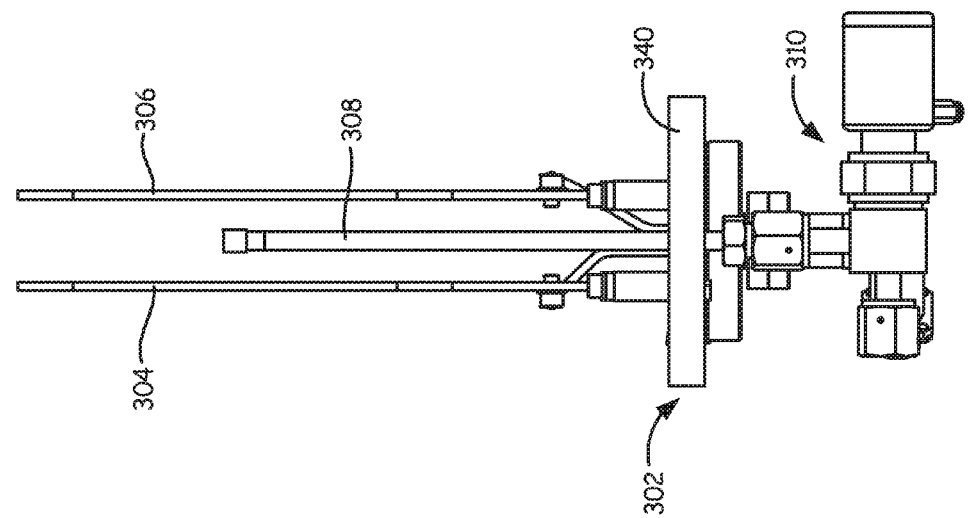

As indicated above, a reactant gas in an etching source such as 300 is formed into plasma by supplying electric power to the reactant gas via electrodes such as 304 and 306. In the embodiment of FIG. 3A, power is supplied to electrodes 304 and 306 of etching source 300 via first electrical connector 314 and second electrical connector 316. In the interest of simplification, no power source is shown in FIG. 3A. Electrical connectors 314 and 316 may be coupled to electrode plates 304 and 306, respectively, in any suitable manner. In some embodiments, first ends 374 and 376 of connectors 314 and 316 may each include a loop that corresponds to a size of through hole 360 in electrode plate 304, 306. Suitably sized bolts may be passed through the loops and the through holes 360 in the electrode plates 304 and 306, and nuts may be screwed on to threaded portions of the bolts. Instead of nuts and bolts, any other suitable types of fasteners may be employed to couple connectors 314 and 316 to electrode plates 304 and 306, respectively. In some embodiments, electrical connectors 314 and 316 are high voltage lines.

As can be seen in FIG. 3I, portions of electrical connectors 314 and 316 pass through electrical power connection assembly 312, which has an end that fits into electrical connection hole 350. Portions of electrical power connection assembly 312 other than the end that fits into electrical connection hole 350 extend outwardly from outer side 336 of mounting plate 302. In some embodiments, electrical power connection assembly 312 includes a power input connector 378, a feed-through tube 379 and a connector flange 380. An end of feed-through tube 379 and a corresponding end of flange 380 include holes to receive fasteners. Fasteners used to hold feed-through tube 379 and connector flange 380 together are not show in the interest of simplification. An interior of feed-through tube 379 includes a cable interlock loop 382 in addition to portions of electrical connectors 314 and 316. Also, as noted above, interlock switch 318 is included in recess 343 at bottom surface 342 of mounting plate 302. Interlock switch 318 and interlock loop 382 are safety features that help ensure that electrical power is supplied to electrodes 304 and 306 only when etching source 300 is properly installed into a compartment of a sputter deposition tool such as 100.

In some embodiments, a ring-shaped view port flange 384 is attached to outer side 336 of mounting plate 302. View port flange 384 is positioned around view port hole 348 in mounting plate 302. View port flange 384 may be employed to hermetically seal optical components (not shown) which may be utilized for visual or broad band energy transmission into and out of a sputter deposition tool such as 100.

Figure 4H:
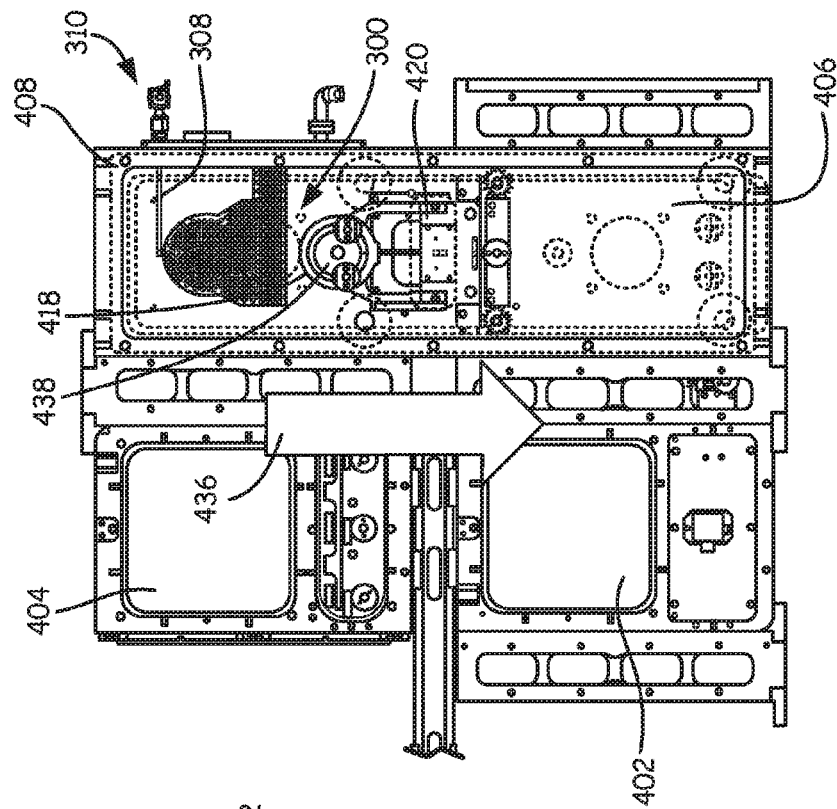

FIG. 4A illustrates a portion of a sputter deposition tool 400 having different compartments 402, 404, 406 and 408. Compartments 406 and 408 are compartments of an elevator 410 of sputter deposition tool 400. Compartments 402 and 404 may be utilized to carry out different sputter deposition process steps. It should be noted that sputter deposition tool 400 may include a plurality of additional compartments that are not shown in FIG. 4. Also, elevator 410 may be a rear elevator of sputter deposition tool 400, and tool 400 may include one or more additional elevators (not shown). FIG. 4B is a rear view of the portion of the sputter deposition tool 400 shown in FIG. 4A. As can be seen in FIG. 4B, compartment 408 of elevator 400 includes an elevator view port plate 412, which includes a first view port 414 and a second view port 416.

In one embodiment, elevator view port plate 412 may be removed from sputter deposition tool 400 and etching source 300 (of FIG. 3A) may be installed into compartment 408 with mounting plate 302 (of FIG. 3A) installed in place of elevator view port plate 412. This is shown in FIGS. 4C-4F. It should be noted that the installation of etching source 300 into elevator compartment 408 does not alter a primary function of elevator 410, which is to move a disc holding fixture 418 its support member 420 (shown in FIGS. 4D and 4E) between a first level 422 (shown in FIG. 4A) and a second level 424 (shown in FIG. 4A) of sputter deposition tool 400.

Figure 4G:
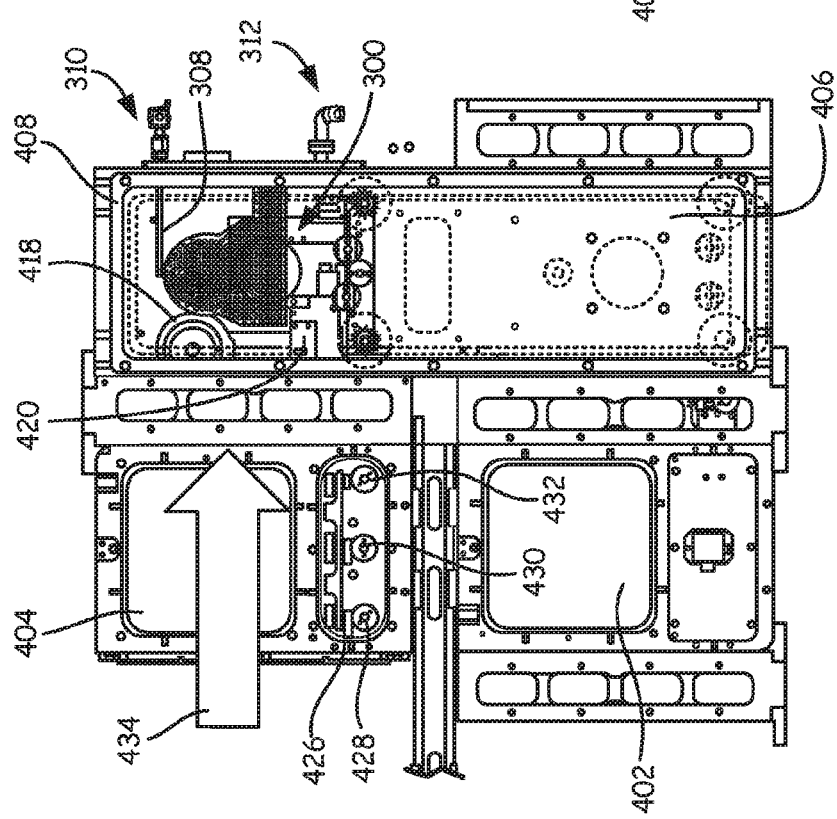

FIGS. 4G and 4F illustrate movement of disc holding fixture 418 and its support member 420 into and out of compartment 408 of sputter deposition tool 400. A conveyor assembly such a 426, which includes multiple conveyor wheels 428, 430 and 432, may be included in one or more of compartments 402, 404, etc., of sputter deposition tool 400 to enable horizontal movement, for example, of disc holding fixture 418 and its support member 420 within sputter deposition tool 400. Arrow 434 shows a direction of horizontal movement of disc holding fixture 418 and its support member 420 into elevator chamber 408. Disc holding fixture 418 is etched within elevator compartment 408 by introducing an etching gas into compartment 408 and by supplying electric power to electrodes of etching source 300. Upon completion of the etching process, disc holding fixture 418 and its support member 420 are moved out of elevator compartment 408 in a downward direction into elevator compartment 406 as shown by arrow 436 in FIG. 4F. It should be noted that, in some embodiments, disc holding fixture 418 may be etched within compartment 408 when a disc substrate 438 is supported in disc holding fixture 418. In other embodiments, disc holding fixture may be etched within compartment 408 without any disc substrate such as 438.

The above-described embodiments provide a low cost etching source 300 that is easily installable in, for example, a sputter deposition tool 400. Etching source 300 utilizes unused space within sputter deposition tool 400. Further, etching source 300 is modular and therefore can be installed and operated in compartments such as 406 or 408. Etching source 300 can also be installed in other elevator compartments (not shown) that may be included in sputter deposition tool 400. In general, etching source 300 can be installed into any suitably shaped compartment of a storage medium processing tool or other similar tool. The modular design allows field as well as factory installation of etching source 300 in sputter deposition tool 400.

FIG. 5A-5K illustrate different views of a plasma etching source 500 in accordance with one embodiment. Like etching source 300, etching source 500 is installable into a compartment of a sputter deposition tool such as 400 (of FIGS. 4A-4F). Details regarding installation and operation of etching source 500 are provided further below. Etching source 500 is a two-section etching source having a first etching source section 502 and a second etching source section 504 positioned substantially opposite first etching source section 502. Top portions of first etching source section 502 and second etching source section 504 may be coupled together by one or more suitable fasteners. Components of first etching source section 502 and second etching source section 504 are substantially similar. Components of first etching source section 502 and second etching source 504 are similar to the components of etching source 300 of FIG. 3A.

As can be seen in FIG. 5A, first etching source section 502 and second etching source section 504 include mounting or support plates 506 and 508. Mounting plate 506 is referred to as a first mounting plate and mounting plate 508 is referred to as a second mounting plate. Each mounting plate 506, 508 may be shaped and sized to correspond with a shape and size of a window of a compartment of a sputter deposition tool such as 400. In addition to mounting plate 506, first etching source section 502 includes an electrode plate 510, a gas valve assembly 512, an electrical power connection assembly 514, an electrical connector 516 and a view port 518. Similarly, in addition to mounting plate 508, second etching source section 504 includes an electrode plate 520, a gas valve assembly 522, an electrical power connection assembly 524, an electrical connector 526 and a view port 528.

A shown in FIG. 5B, insulating supports 534, 536 and 538, and fasteners 540, 542 and 544 are employed to couple electrode plate 510 to mounting plate 506. Similarly, as shown in FIGS. 5C and 5F, insulating supports 546, 548 and 550 and fasteners 554, 556 and 558 couple electrode plate 520 to mounting plate 508. FIGS. 5D and 5E show additional views of second etching source section 504. As can be seen in FIGS. 5F and 5G, electrode plate 520 includes through holes 560 that are similar to through holes 360 in electrode plates 304 and 306 (of FIG. 3A). Additionally, electrode plate 520 includes through holes 562, which are each sized to receive an end of insulating support 546, 448 and 550. Electrode plate 510 includes holes similar to those included in electrode plate 520.

Figure 5H:
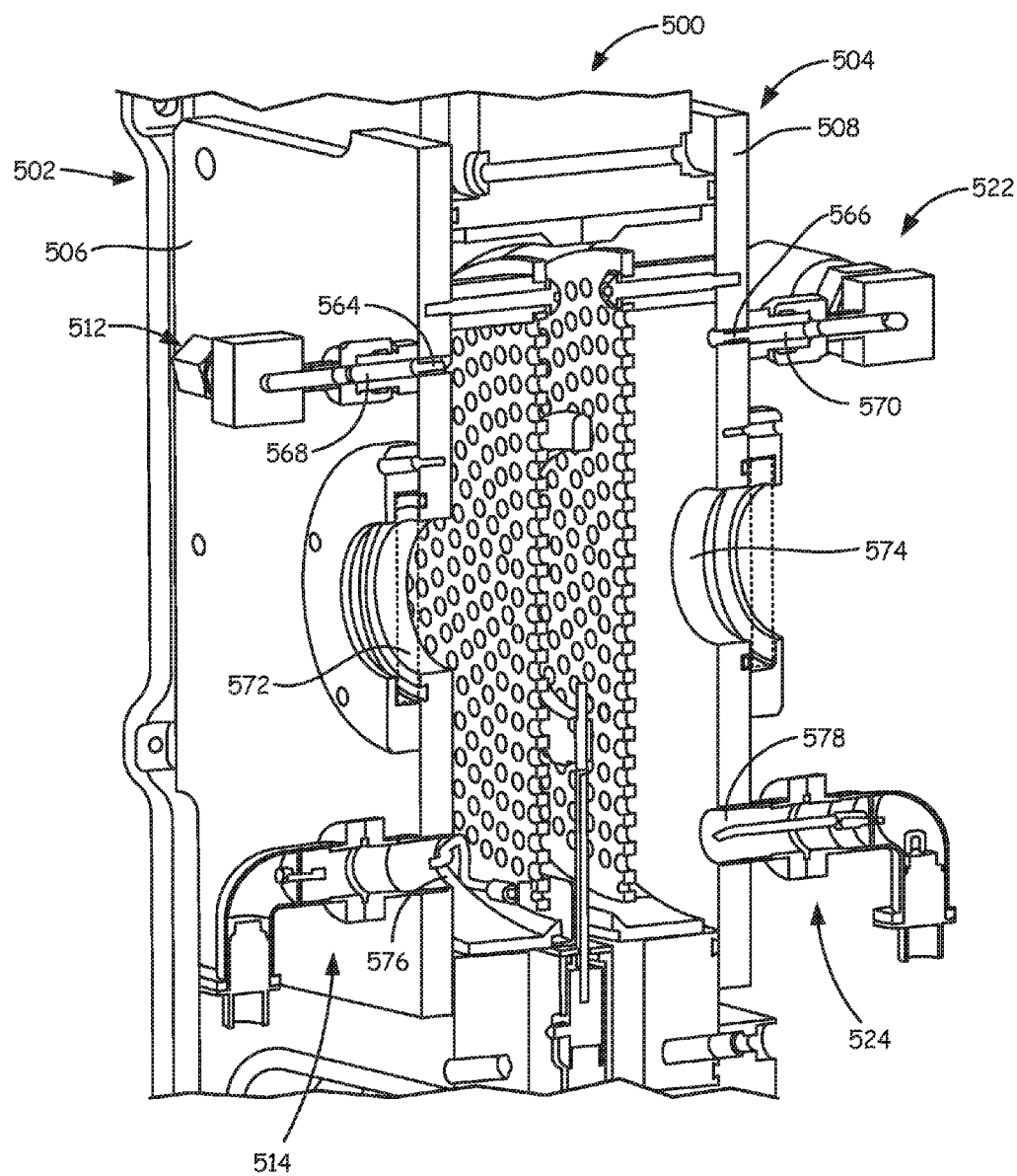

FIG. 5H is a sectional view of etching source 500. In addition to the components of etching source 500 shown in FIGS. 5A, FIG. 5H shows gas inlets 564 and 566, which are aligned with outlets 568 and 570 of gas valve assemblies 512 and 524, respectively. Further, FIG. 5H shows view port holes 572 and 574 in mounting plates 504 and 506, respectively. Also seen in FIG. 5H are electrical connector holes 576 and 578.

FIG. 5I is an exploded view of etching source section 502. In addition to the components of etching tool 500 shown and described above in connection with FIGS. 5A-5H, FIG. 5I shows sub-components of view port 518 and of electrical power connection assembly 514. As can be seen in FIG. 5I, electrical power connection assembly 514 includes a power input connector 580, a feed-through tube 582 and a connector flange 584. An end of feed-through tube 582 and a corresponding end of connector flange 584 include holes to receive fasteners. Fasteners used to hold feed-through tube 582 and connector flange 584 together are not show in the interest of simplification. View port 518 includes a lens 586, a view port flange 588 and a gasket of loop (for example, an O-ring seal) 590. Washers 592 that fit around fasteners (for, example, bolts) 540, 542 and 544 are also shown in FIG. 5I. Component 589 in FIG. 5I is a fitting for an external gas line. This component is also shown in FIGS. 6A and 6G.

As noted above, etching source 500 is installable into a compartment of a sputter deposition tool such as 400 (of FIGS. 4A-4F). FIGS. 5J and 5K show interior and exterior views, respectively, of first etching source section 502 installed into compartment 402, 404 of sputter deposition tool 400. It should be noted that second etching source section 504, which is not shown in FIGS. 5J and 5K, is installed into the same compartment 402, 404 of the sputter deposition tool 400 and positioned substantially opposite the first etching source section 502 within that compartment 402, 404. For example, the first etching source section 502 and the second etching source section 504 may be installed into opposing windows of compartments 402 or 404 of sputter deposition tool 400. Once etching source 500 is properly installed in sputter deposition tool 400, etching of, for example, a disc holding fixture such as 418 may be carried out. Referring back to FIG. 5A, disc holding fixture 418 and its support member 420, described earlier in connection with FIGS. 4G and 4F, are introduced between first etching source section 502 and second etching source section 504 with the help of conveyor assembly 426, which includes multiple conveyor wheels 428, 430 and 432 that enable horizontal movement of disc holding fixture 418 and its support member 420. When properly positioned within etching source 500 installed in sputter deposition tool 400, disc holding fixture 418 may be etched in a manner described above in connection with FIGS. 3A-3I.

Figure 6F:
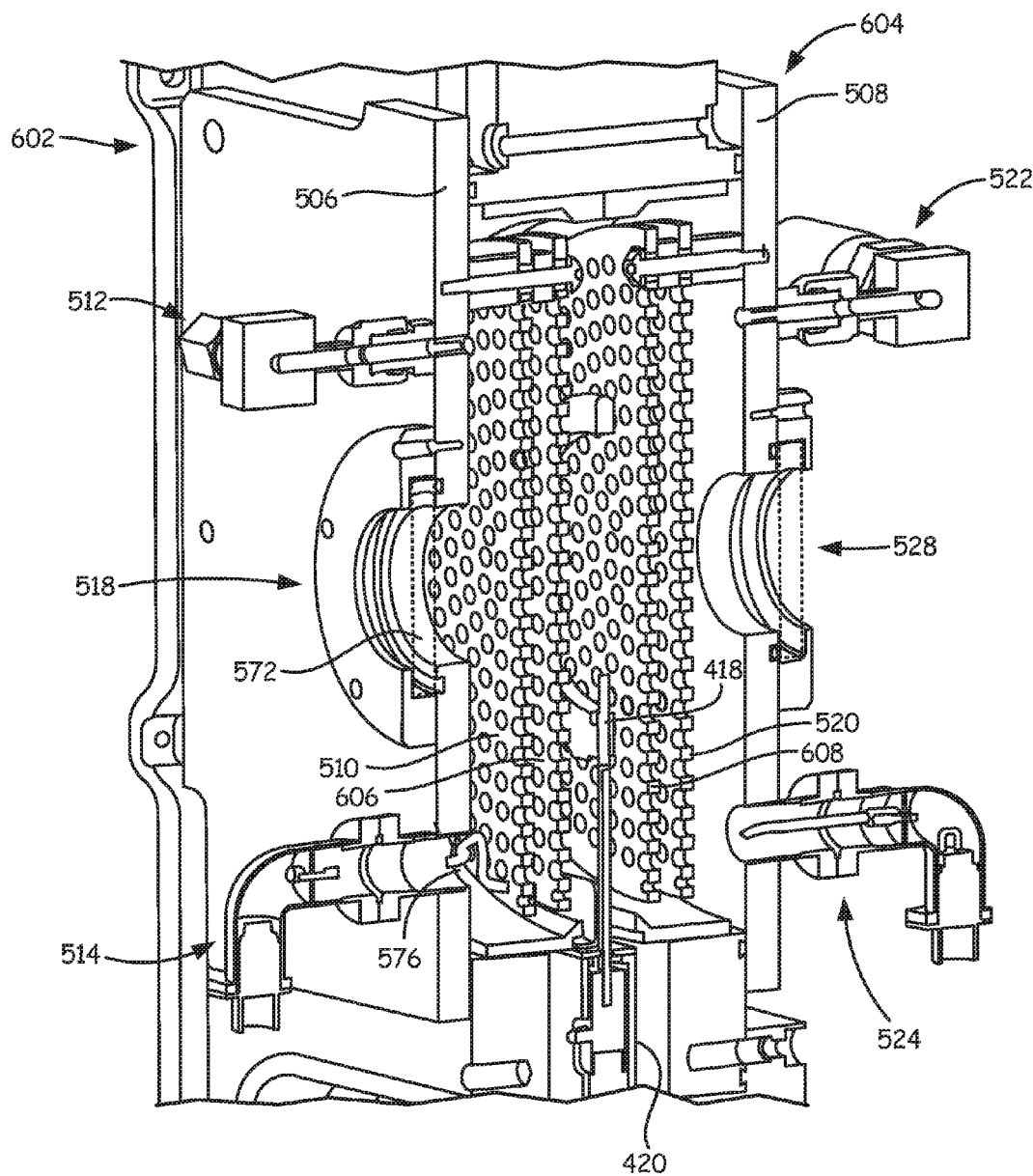

FIGS. 6A-6H illustrate different views of a plasma etching source 600 in accordance with one embodiment. Etching source 600 includes components that are similar to components included in etching source 500 (of FIGS. 5A-5K). The same reference numerals are used for the similar components. Also, a description of the similar components is not repeated. Etching source 500 (of FIGS. 5A-5K), which is described above, includes etching source sections 502 and 504, which each have a single electrode plate 510, 520. However, etching source 600 includes an additional electrode plate 606, 608 in each of its etching source sections 602 and 604. Different ones of electrode plates 510, 520, 606 and 608 may be referred to as first, second, third and fourth electrode plates. As shown in FIG. 6G, insulating supports 610, 612 and 614 are employed to support additional electrode plate 606. Similar insulating supports 616, 618 and 620 used to support additional electrode plate 608 are shown in FIG. 6C. Further, as show in FIG. 6G, an additional electrical connector 624 is utilized to couple to additional electrode plate 606. A similar additional electrical connector 626 utilized to couple to additional electrode plate 608 is shown in FIG. 6C.

Figure 6H:
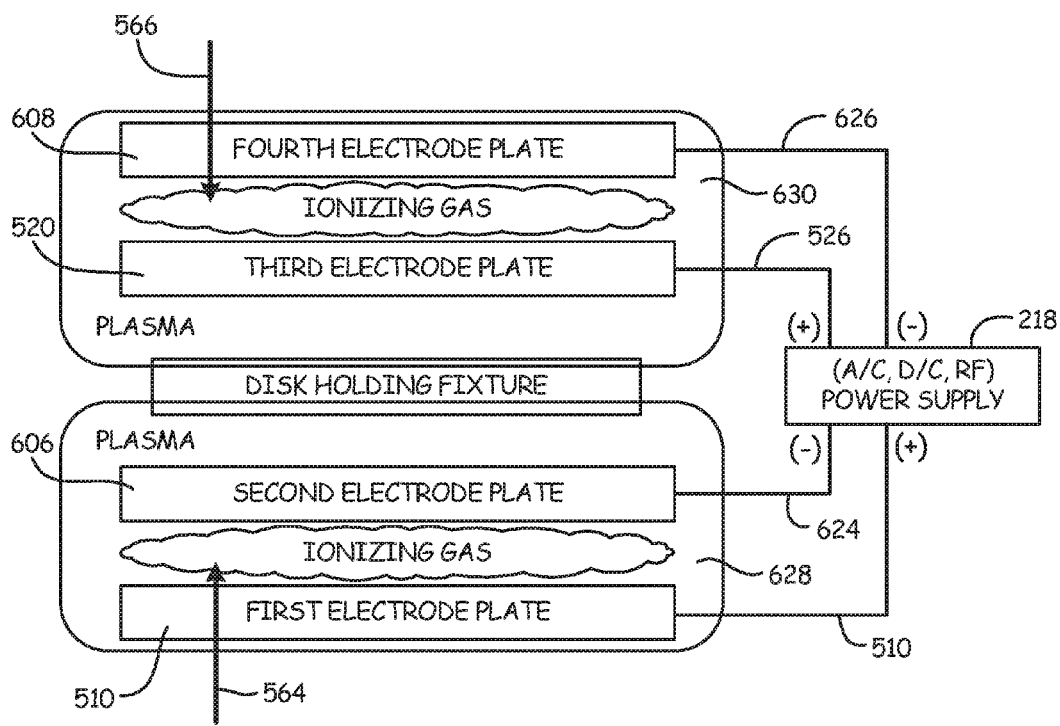

FIG. 6H is a simplified block diagram showing an electrical connection configuration that may be used to generate plasma in a plasma etching source such as 600. As can be seen in FIG. 6A, first electrical connector 516 and second electrical connector 624 are coupled to electrode plates 510 and 606, respectively. Similarly, electrical connectors 526 and 626 are coupled to electrode plates 520 and 608, respectively. Electrical connectors 510 and 526 are connected to a positive terminal of power supply 218 and electrical connectors 624 and 626 are connected to a negative terminal of power supply 218. It should be noted that a reaction chamber that encloses components of plasma etching source 600 is not shown in FIG. 6H in the interest of simplification. In operation, plasma 628 may be generated by providing power to electrode plates 510 and 606 in a manner described above in connection with FIG. 2. Plasma 630 is generated in a similar manner. As can be seen in FIG. 6H, in such an embodiment, disc holding fixture 418 (of FIG. 4A) is subjected to both plasma 628 and plasma 630. Etching of disc holding fixture 418 in etching source 600 may be carried out in a manner similar to that described above connection with FIG. 2, for example. Also, etching source 600 is installable into a sputter deposition tool such as 400 (of FIG. 4A) in a manner described above in connection with FIGS. 5A-5K. Substantially simultaneously applying plasma 628 and plasma 630 to different surfaces of disc holding fixture 418, which is at a floating potential, enables substantially simultaneous etching of the different surfaces of disc holding fixture 418.

Although various uses of the etching source are disclosed in the application, embodiments are not limited to those disclosed in the application. It is to be understood that even though numerous characteristics of various embodiments of the disclosure have been set forth in the foregoing description, together with details of the structure and function of various embodiments of the disclosure, this disclosure is illustrative only, and changes may be made in detail, especially in matters of structure and arrangement of parts within the principles of the present disclosure to the full extent indicated by the broad general meaning of the terms in which the appended claims are expressed. For example, the elements may vary depending on the application for the etching source while maintaining substantially the same functionality without departing from the scope and spirit of the present disclosure. In addition, although the embodiments described herein are directed to etching sources utilized to etch holding fixtures in sputter deposition tools, it will be appreciated by those skilled in the art that the teachings of the present disclosure can be applied to etching sources installable into storage medium processing tools other than sputter deposition tools, without departing from the scope and spirit of the present disclosure. It should be noted that the number and type of gas inlets, gas valves, gas line fittings, etc., are not limited to those shown in the embodiments described above. Also, positions of gas inlets, gas valves, gas lines, etc., may differ for different applications and are not limited to the positions shown above.

What is claimed is:
1. An apparatus comprising:
a sputter deposition tool having a plurality of compartments with at least one compartment having at least one mounting plate installation window; and
an etching source comprising at least one mounting plate removably installable into the at least one mounting plate installation window of the at least one compartment of the plurality of compartments of the sputter deposition tool, wherein the at least mounting plate is sized to correspond to a size of an opening of the at least one mounting plate installation window, and wherein the opening is closed by the at least one mounting plate when the at least one mounting plate is installed into the at least one mounting plate installation window, wherein the etching source is a parallel electrode etching source configured to etch opposing surfaces of an element positioned between the parallel electrodes, and wherein at least one of the parallel electrodes is coupled to the at least one mounting plate, and wherein the parallel electrodes are connected to a same power supply with a first terminal of the same power supply directly electrically connected to a first one of the parallel electrodes and a second terminal of the same power supply directly electrically connected to a second one of the parallel electrodes, and wherein the power supply is configured the provide a voltage between the parallel electrodes that enables plasma formation between the parallel electrodes, and wherein the element positioned between the parallel electrodes is configured to be held at a floating potential, at which the element collects no current, within the plasma.

2. The apparatus of claim 1 and further comprising a storage medium holding fixture configured to pass through the at least one compartment having the at least one mounting plate installation window when the etching source is installed into the at least one mounting plate installation window and configured to pass through other ones of the plurality of compartments, wherein the storage medium holding fixture is configured to pass between the parallel electrodes.

3. The apparatus of claim 1 and wherein the etching source is a plasma etching source, and wherein the element positioned between the parallel electrodes is a storage medium holding fixture without any storage medium.

4. The apparatus of claim 2 and wherein the parallel electrodes are sized to correspond with a size of the storage medium holding fixture.

5. The apparatus of claim 1 and wherein the at least one compartment having the at least one mounting plate installation window is an elevator compartment.

6. The apparatus of claim 1 and wherein the etching source is a plasma etching source, and wherein the element positioned between the parallel electrodes is a storage medium substrate supported by a storage medium holding fixture.

7. The apparatus of claim 1 and wherein the at least one mounting plate further comprises a gas inlet.

8. The apparatus of claim 1 and further comprising an electrical feed-through flange coupled to the at least one mounting plate.

9. The apparatus of claim 1 and wherein the at least one mounting plate comprises a view port.

10. The apparatus of claim 5 and wherein the etching source is a plasma etching source, and wherein the element positioned between the parallel electrodes is a storage medium substrate supported by a storage medium holding fixture.

11. The apparatus of claim 5 and wherein the at least one mounting plate further comprises a gas inlet.

12. The apparatus of claim 5 and further comprising an electrical feed-through flange coupled to the at least one mounting plate.

13. The apparatus of claim 5 and wherein the at least one mounting plate comprises a view port.

\* \* \* \* \*